United States Patent
Sano et al.

(10) Patent No.: US 9,960,757 B2
(45) Date of Patent: May 1, 2018

(54) SEMICONDUCTOR APPARATUS AND RADIO COMMUNICATION APPARATUS

(71) Applicant: Renesas Electronics Corporation, Tokyo (JP)

(72) Inventors: Tomohiro Sano, Tokyo (JP); Masakazu Mizokami, Tokyo (JP); Kenji Toyota, Tokyo (JP); Yoshikazu Furuta, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/597,833

(22) Filed: May 17, 2017

(65) Prior Publication Data

US 2017/0250684 A1 Aug. 31, 2017

Related U.S. Application Data

(63) Continuation of application No. 14/845,526, filed on Sep. 4, 2015, now Pat. No. 9,680,457.

(30) Foreign Application Priority Data

Sep. 5, 2014 (JP) .................................. 2014-181126

(51) Int. Cl.
| H03K 5/1252 | (2006.01) |
| H04B 1/04 | (2006.01) |
| H04L 27/04 | (2006.01) |
| H03K 5/24 | (2006.01) |

(52) U.S. Cl.
CPC ............. *H03K 5/1252* (2013.01); *H03K 5/24* (2013.01); *H04B 1/0475* (2013.01); *H04L 27/04* (2013.01)

(58) Field of Classification Search
CPC ........ H03K 5/1252; H03K 5/24; H04L 27/04; H04B 1/0475
See application file for complete search history.

(56) References Cited

U.S. PATENT DOCUMENTS

| 4,639,679 | A | 1/1987 | Kasperkovitz et al. |
| 5,973,568 | A | 10/1999 | Shapiro et al. |
| 8,164,387 | B1 | 4/2012 | Apel et al. |
| 2002/0094791 | A1 | 7/2002 | Pehike |
| 2002/0167369 | A1 | 11/2002 | Yamaji |
| 2009/0280767 | A1 | 11/2009 | Tillman |
| 2010/0123945 | A1 | 5/2010 | Kai |
| 2011/0241793 | A1 | 10/2011 | Frye |
| 2013/0154735 | A1 | 6/2013 | Hase |

OTHER PUBLICATIONS

Extended European Search Report dated Jan. 29, 2016.
Japanese Office Action dated Mar. 13, 2018, with an English translation.

*Primary Examiner* — Vineeta Panwalkar
(74) *Attorney, Agent, or Firm* — McGinn IP Law Group, PLLC

(57) ABSTRACT

A semiconductor apparatus includes a common mode detector circuit that receives differential alternating current (AC) signal; and a detector circuit.

7 Claims, 24 Drawing Sheets

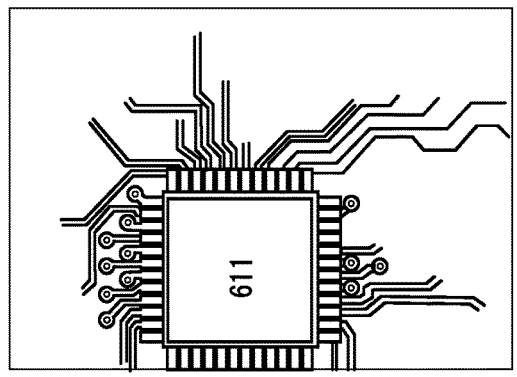
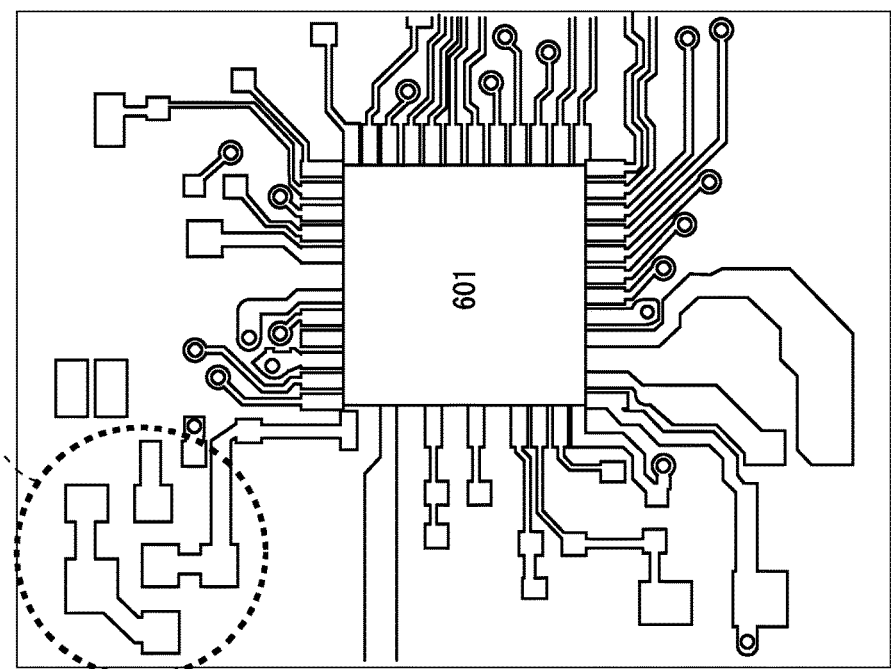
Fig. 22

SEMICONDUCTOR APPARATUS AND RADIO COMMUNICATION APPARATUS

This application is a Continuation application of U.S. patent application Ser. No. 14/845,526, filed on Sep. 4, 2015, now U.S. Pat. No. 9,680,457.

CROSS-REFERENCE TO RELATED APPLICATIONS

This application is based upon and claims the benefit of priority from Japanese patent application No. 2014-181126, filed on Sep. 5, 2014, the disclosure of which is incorporated herein in its entirety by reference.

BACKGROUND

Technical Field

The present invention relates to a semiconductor apparatus and a radio communication apparatus. For example, the present invention relates to a semiconductor apparatus and a radio communication apparatus that perform calibration for suppressing the second harmonic.

Background Art

In recent years, the demand for computer devices using wireless communication such as Bluetooth is increasing. Further, in order to be mounted on wearable devices, a radio circuit is required to have a single-chip configuration. Accordingly, the radio circuit has been increasingly mounted on a semiconductor apparatus, e.g., as a microcomputer or by the SoC (System on a Chip).

A radio circuit mounted on a semiconductor apparatus structures a radio apparatus by being connected to a chip resistor and a chip inductor which are provided on a substrate along with the semiconductor apparatus. With such a radio apparatus, the power of a transmission signal is amplified and transmitted from an antenna as a radio signal. Here, a class-D amplifier used to amplify the transmission signal uses pulse width modulation or pulse density modulation. Then, when the power of the transmission signal is amplified at a switching circuit, harmonics are generated.

Patent Literature 1 discloses a technique for suppressing such harmonics. According to Patent Literature 1, by allowing the amplified transmission signal to pass through an LPF (Low Pass Filter), harmonics whose frequencies are higher than the transmission signal are suppressed.

SUMMARY

Problem to be Solved by the Invention

The conventional apparatus requires the LPF for passing a transmission signal of great power. Accordingly, there is a problem that, without the LPF, to what extent the harmonics are produced cannot be found.

Other problems and novel features will become apparent from the following description and accompanying drawings.

Means for Solving Problem

According to one embodiment, a semiconductor apparatus includes a common mode detector circuit and a detector circuit. The common mode detector circuit detects AC signals in a common mode. The detector circuit detects the amplitude level of the even-order harmonics output from the common mode detector circuit.

Effect of the Invention

According to the one embodiment, the amplitude level of the harmonics can be detected.

BRIEF DESCRIPTION OF THE DRAWINGS

The above and other aspects, advantages and features will be more apparent from the following description of certain embodiments taken in conjunction with the accompanying drawings, in which:

FIG. 22 is a diagram showing exemplary packaging substrates;

DETAILED DESCRIPTION

Figure 1:
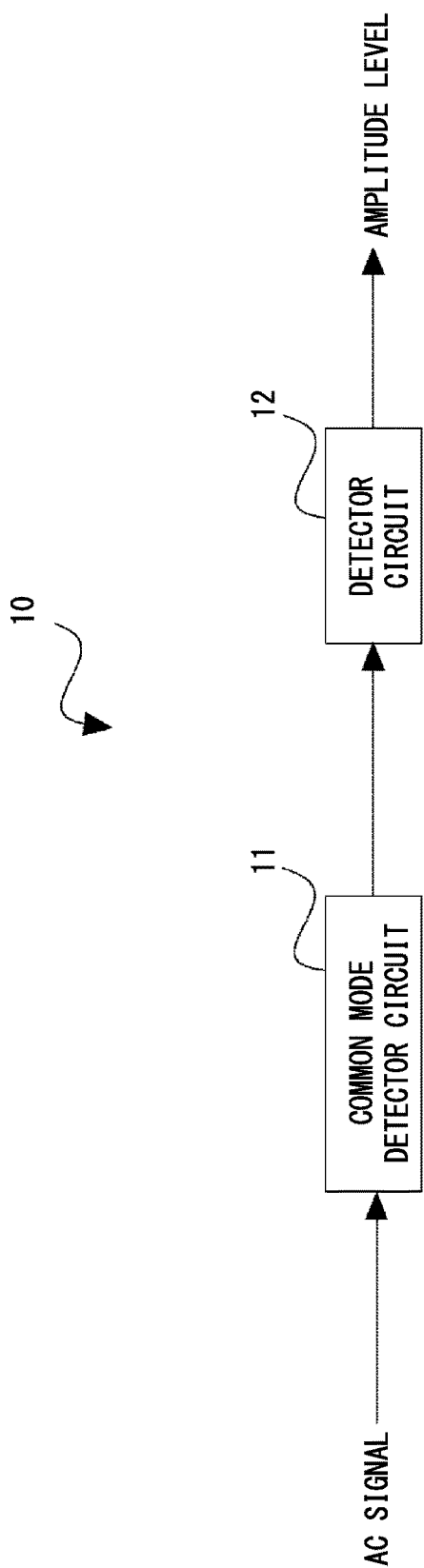
FIG. 1 is a configuration diagram showing the overview configuration of a semiconductor apparatus according to an embodiment.

Best Modes for Carrying Out the Invention

For the sake of clarity, the following description and accompanying drawings are omitted and simplified as appropriate. Further, the elements shown in the drawings as functional blocks performing various processing may be formed by a CPU, memory, and other circuits in hardware, and may be realized by a program or the like loaded on memory in software. Accordingly, a person skilled in the art would understand that these functional blocks may be realized in various ways, i.e., solely by hardware, solely by software, or by a combination thereof without any limitation. Note that, throughout the drawings, identical reference characters are allotted to identical elements, and repetitive descriptions are omitted as necessary.

In the following embodiments, the invention will be described in a plurality of sections or embodiments when required for the sake of convenience. However, these sections or embodiments are not unrelated to one another unless otherwise stated. One of these sections or embodiments relates to part of or the entire other sections or embodiments as a modification, an application, details, or a supplementary explanation. Also, in the following embodiments, when a reference is made to the number or the like of elements (including the number of pieces, numerical values, amount, range and the like), the present invention is not limited to such a specific number unless otherwise stated or unless being apparently limited to such a specific number on principle, and the number of elements may be greater or smaller than that specific number.

Further, in the following embodiments, the constituent elements (including operation steps and the like) are not always essential unless otherwise stated or unless they are apparently essential on principle. Similarly, in the following embodiments, when a reference is made to the shape or positional relationship of the constituent elements, a substantially approximate or similar shape or the like is included unless otherwise stated or unless it may not hold on principle. The same holds true for the above-noted numbers or the like (including the number of pieces, numerical values, amounts, ranges and the like).

Overview of Embodiment

FIG. 1 is a configuration diagram showing the overall configuration of a semiconductor apparatus according to an embodiment. As shown in FIG. 1, a semiconductor apparatus 10 according to the embodiment includes a common mode detector circuit 11 that detects AC signals in the common mode, and a detector circuit 12 that detects an amplitude level of an even-order harmonic output from the common mode detector circuit.

The common mode detector circuit 11 combines AC signals being differential signals in common mode, thereby cancelling out odd-order harmonics to obtain direct current and even-order harmonics. Then, the common mode detector circuit 11 outputs the obtained signal to the detector circuit 12.

The detector circuit 12 detects the signal obtained by the common mode detection, to obtain the amplitude level of an even-order harmonic therefrom. Then, the detector circuit 12 outputs the detected amplitude level.

As shown in FIG. 1, by detecting the AC signals in the common mode, and detecting the obtained signal, the amplitude level of the harmonics can be detected.

First Embodiment

Figure 2:
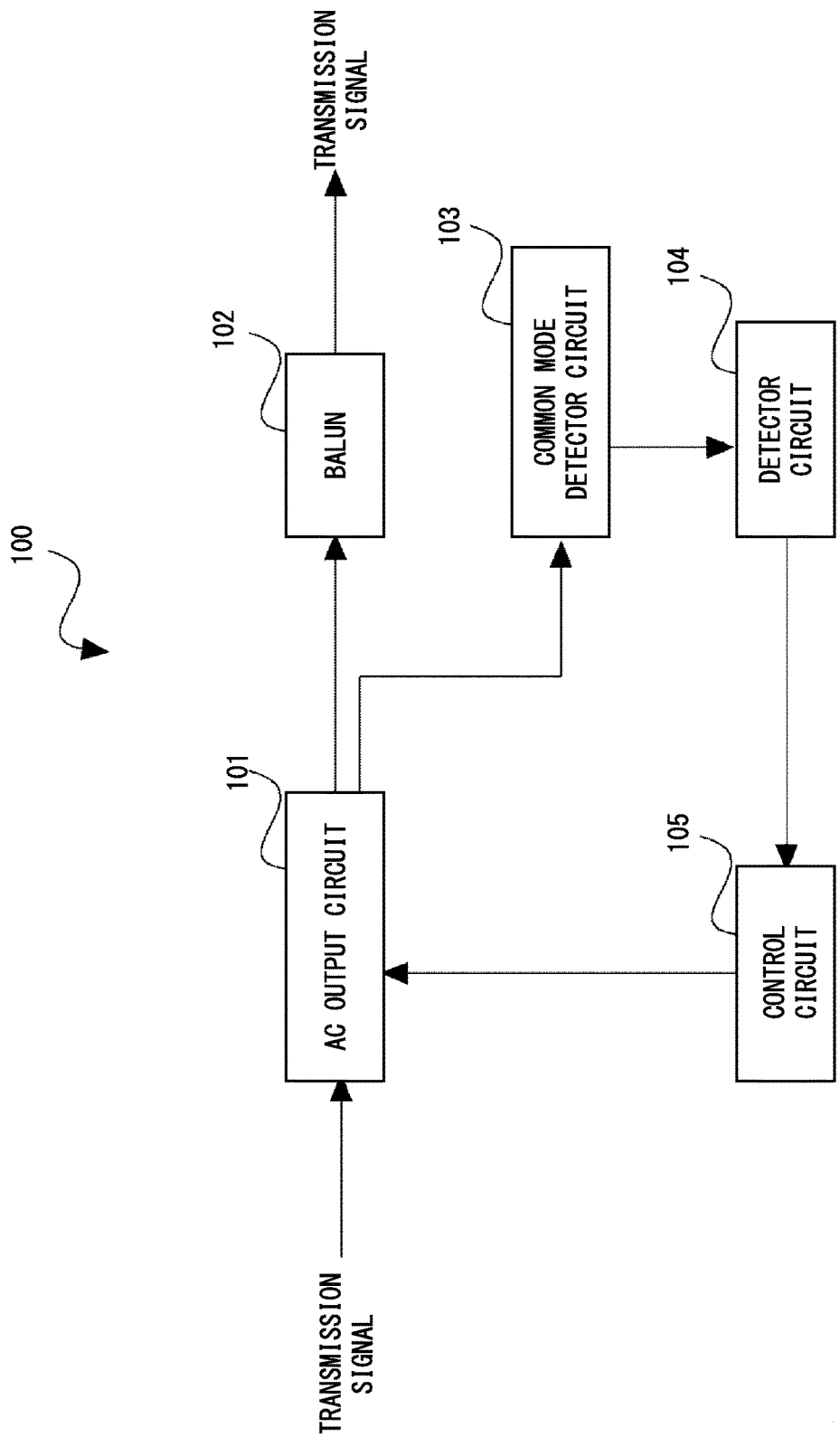
FIG. 2 is a diagram showing the configuration of a semiconductor apparatus according to a first embodiment.

In the following, a description will be given of a first embodiment with reference to the drawings. FIG. 2 is a diagram showing a semiconductor apparatus according to the first embodiment. As shown in FIG. 2, a semiconductor apparatus 100 includes an AC output circuit 101, a balun 102, a common mode detector circuit 103, a detector circuit 104, and a control circuit 105.

The AC output circuit 101 amplifies input AC signals being differential signals, and outputs the amplified AC signals to the balun 102 and the common mode detector circuit 103. For example, the AC output circuit amplifies the AC signals using a class-D amplifier. The class-D amplifier amplifies power at a switching circuit using pulse width modulation.

The balun 102 performs balanced-unbalanced conversion to the AC signals being differential signals, and transmits the converted signals as radio signals via an antenna.

The common mode detector circuit 103 combines the AC signals being the differential signals in common mode, thereby cancelling out odd-order harmonics to obtain direct current and even-order harmonics. Then, the common mode detector circuit 103 outputs the obtained signal to the detector circuit 104. For example, the common mode detector circuit 103 may be configured by a circuit that combines differential signals through use of resistors.

The detector circuit 104 detects the signal obtained by the common mode detection, to obtain the amplitude level of even-order harmonics. Then, the detector circuit 104 outputs the detected amplitude level to the control circuit 105.

The control circuit 105 controls and determines parameters of the AC output circuit, such that the amplitude level obtained by the detector circuit 104 becomes a minimum. For example, the control circuit 105 varies the duty ratio of the class-D amplifier of the AC output circuit 101 in performing pulse width modulation, to obtain the relationship between the duty ratio and the amplitude level of the even-order harmonics. Then, the control circuit 105 instructs the AC output circuit 101 about the duty ratio with which the amplitude level of the even-order harmonics becomes a minimum.

Figure 3:
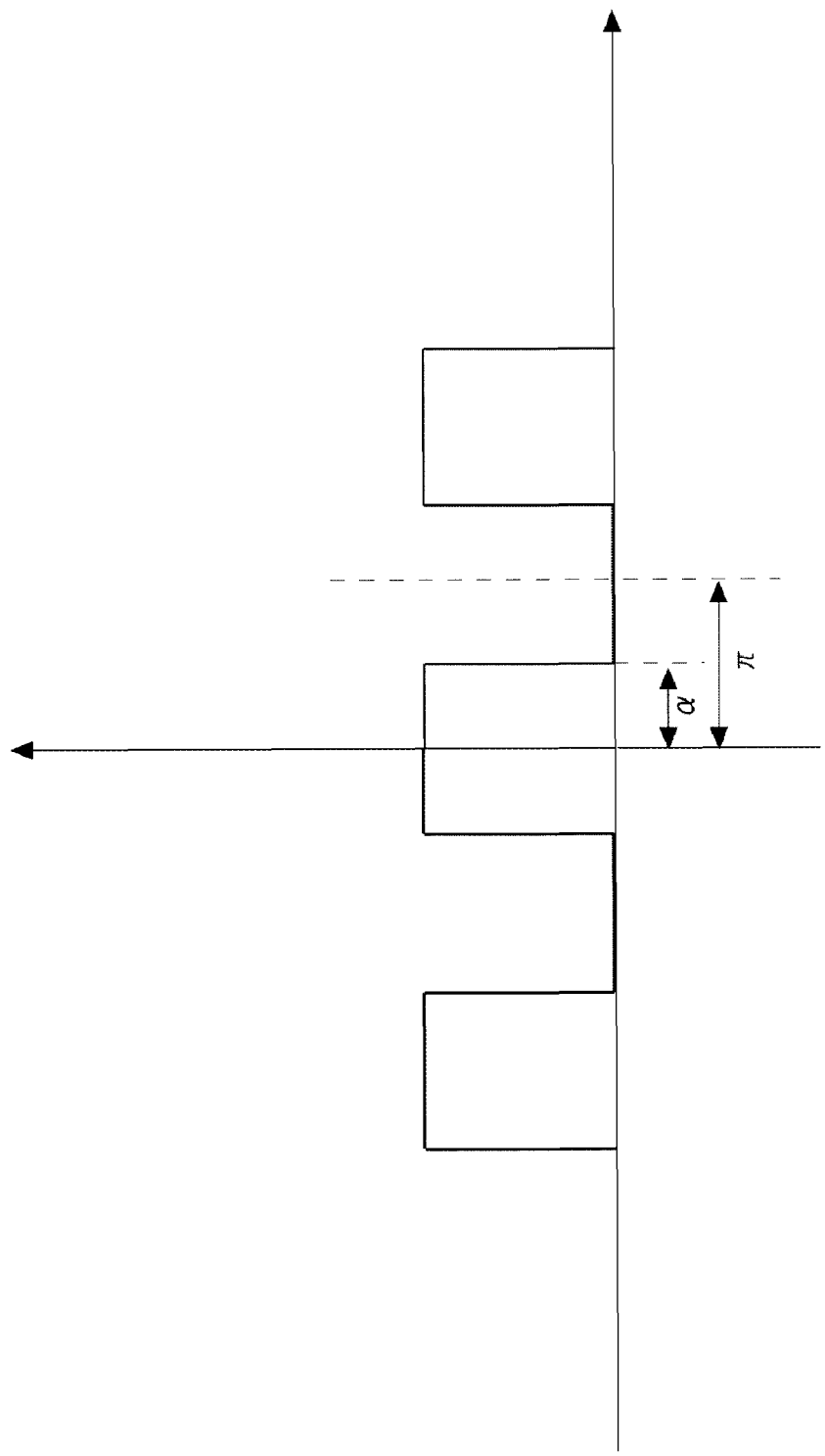
FIG. 3 is a diagram showing an exemplary pulse waveform.

In connection with the class-D amplifier, when the duty ratio varies, the amplitude level of the generated harmonics also varies. FIG. 3 is a diagram showing an exemplary pulse waveform. In FIG. 3, the horizontal axis represents the time point, and the vertical axis represents the voltage. Further, in FIG. 3, n represents the half cycle time, and a represents the time from the center of a pulse waveform to a change in the voltage.

In FIG. 3, the voltage of the pulse waveform is represented by the following Mathematical Expression (1).

$$V = \frac{\alpha}{\pi} + \frac{2}{\pi}\left(\sin\alpha\cos\omega t + \frac{\sin 2\alpha}{2}\cos 2\omega t + \frac{\sin 3\alpha}{3}\cos 3\omega t + \ldots \frac{\sin k\alpha}{k}\cos k\omega t\right)$$

Mathematical Expression (1)

In Mathematical Expression (1), ω is the frequency of the pulse signal, and t is the time point. Further, k is a natural number.

Here, when the duty ratio is 0.5, $\alpha=\pi/2$ is established. Then, the voltage of the pulse waveform is represented by the following Mathematical Expression (2).

$$V = \frac{1}{2} + \frac{2}{\pi}\left(\cos\omega t + \frac{\cos 3\omega t}{3} + \ldots \frac{\cos(2k-1)\omega t}{2k-1}\right) \quad \text{Mathematical Expression (2)}$$

On the other hand, when the duty ratio deviates from 0.5, $\alpha=\beta+\pi/2$ (where $\beta$ is an arbitrary value) is established. Then, the voltage of the pulse waveform is represented by the following approximate expression (3).

$$V \approx \frac{1}{2} + \frac{\beta}{\pi} + \frac{2}{\pi}\left(\cos\omega t - \beta\cos 2\omega t + \frac{\cos 3\omega t}{3} + \ldots\right) \quad \text{Mathematical Expression (3)}$$

In Mathematical Expression (3), the DC component is represented by $\frac{1}{2}+\beta/\pi$. The second harmonic is represented by the following Mathematical Expression (4).

$$\frac{1}{2\pi} \times \sin\left(2\beta + \frac{\pi}{1}\right) \approx \frac{\beta}{\pi} \quad \text{Mathematical Expression (4)}$$

Here, when the value of $\beta$ is small, Sin $\beta$ can approximate to $\beta$. Accordingly, the second harmonic approximates to $\beta/\pi$. That is, the second harmonic becomes greater as the duty ratio more largely deviates from 0.5. The semiconductor apparatus 100 according to the first embodiment detects the deviation of the duty ratio from the relationship between the duty ratio and the amplitude level of harmonics.

Specifically, the differential signals input to the AC output circuit 101 are defined by the following Mathematical Expression (5) and Mathematical Expression (6).

$$VCMIT = \frac{\alpha}{\pi} + \frac{2}{\pi}\left(\sin\alpha\cos\omega t + \frac{\sin 2\alpha}{2}\cos 2\omega t + \frac{\sin 3\alpha}{3}\cos 3\omega t + \ldots + (+1)^k\frac{\sin k\alpha}{k}\cos k\omega t\right) \quad \text{Mathematical Expression (5)}$$

$$VCMIB = \frac{\alpha}{\pi} + \frac{2}{\pi}\left(-\sin\alpha\cos\omega t + \frac{\sin 2\alpha}{2}\cos 2\omega t - \frac{\sin 3\alpha}{3}\cos 3\omega t + \ldots + (-1)^k\frac{\sin k\alpha}{k}\cos k\omega t\right) \quad \text{Mathematical Expression (6)}$$

The common mode detector circuit 103 obtains arithmetic mean of the voltages of the differential signals. Accordingly, the output of the common mode detector circuit 103 is represented by the following Mathematical Expression (7).

$$VCMDET\_O = \frac{\alpha}{\pi} + \frac{2}{\pi}\left(\frac{\sin 2\alpha}{2}\cos 2\omega t \ldots + [(+1)^k - (-1)^k]\frac{\sin k\alpha}{2k}\cos k\omega t\right) \quad \text{Mathematical Expression (7)}$$

Here, rewriting the expression to express $\alpha$ with D ("H" time in one cycle/one cycle time, MAX=1), the output of the common mode detector circuit 103 is represented by the following Mathematical Expression (8). In Mathematical Expression (8), the range of D is: 0<D<1.

$$VCMDET\_O = D + \frac{2}{\pi}\left(\frac{\sin 2(D\cdot\pi)}{2}\cos 2\omega t \ldots + [(+1)^k - (-1)^k]\frac{\sin k(D\cdot\pi)}{2k}\cos k\omega t\right) \quad \text{Mathematical Expression (8)}$$

In the output signal represented by Mathematical Expression (8), the third and higher order components are negligible by natural attenuation. Accordingly, focusing on the first two terms of Mathematical Expression (8), it can be expressed as Mathematical Expression (9).

$$VCMDET\_O = D + \frac{2}{\pi}\left(\frac{\sin 2(D\cdot\pi)}{2}\cos 2\omega t\right) \quad \text{Mathematical Expression (9)}$$

Here, the coefficient ($e_1$) of the first term and the coefficient ($e_2$) of the second term are represented by Mathematical Expression (10) and Mathematical Expression (11), being monotonic increasing and reducing coefficients.

$$e_1 = D \quad \text{Mathematical Expression (10)}$$

$$e_2 = \frac{1}{\pi}\sin 2(D\cdot\pi) \quad \text{Mathematical Expression (11)}$$

The signal of VCMDET_O is subsequently input to the detector circuit 104. For the purpose of avoiding malfunction, the detector circuit 104 is configured by a circuit having a function of removing the DC component and a function of detecting mainly the peak value of the amplitude. Then, the coefficients in the peak detector circuit output waveform (VDET_O) is calculated from the coefficients $e_1/e_2$, which are represented by Mathematical Expression (12) and Mathematical Expression (13).

$$e_1 = 0 \quad \text{Mathematical Expression (12)}$$

$$e_2 = \left|\frac{1}{\pi}\sin 2(D\cdot\pi)\right| \quad \text{Mathematical Expression (13)}$$

Here, the $e_2$ component is removed by the detector circuit 104. A VLPF_O from which the high frequency range is removed by the LPF in the detector circuit 104 can be represented by the following Mathematical Expression (14).

$$VLPF\_O = \left|\frac{\sin 2(D\cdot\pi)}{\pi}\right| \quad \text{Mathematical Expression (14)}$$

Figure 4:
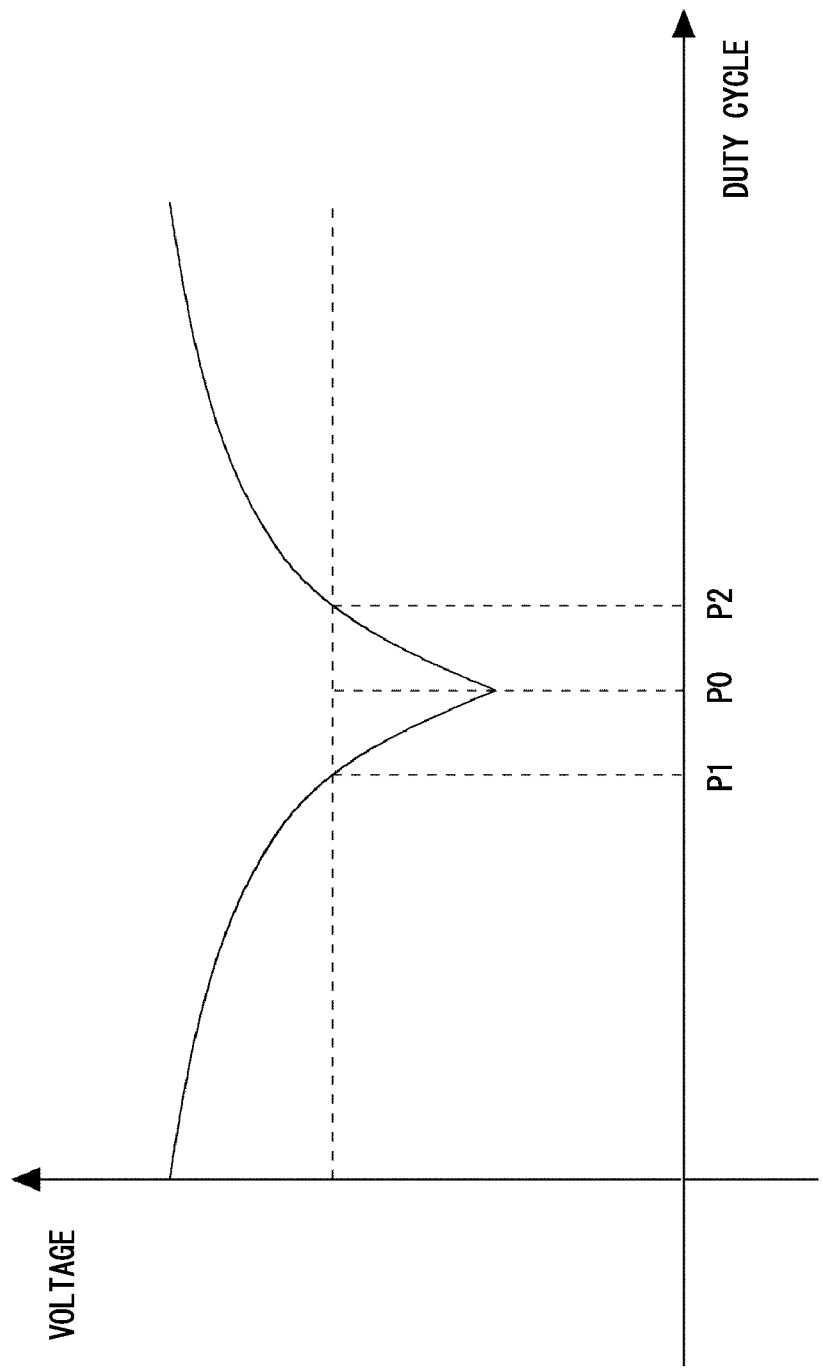
FIG. 4 is a diagram showing the relationship between the duty ratio of an amplifier and the amplitude level of a harmonic.

In Mathematical Expression (14), the value that derives D=0.5 is the duty ratio that can suppress the second harmonic the most. FIG. 4 is a diagram showing the relationship between the duty ratio of the amplifier and the amplitude level of a harmonic. In FIG. 4, the horizontal axis represents the duty ratio of the class-D amplifier of the AC output circuit 101, and the vertical axis represents the amplitude of the second harmonic obtained by the common mode detection carried out by the common mode detector circuit 103.

As shown in FIG. 4, at the point where the duty ratio is P0, the amplitude of the second harmonic becomes a minimum. Further, the values of the amplitude of the second harmonic are symmetrical with reference to the point where the duty ratio is P0.

Figure 5:
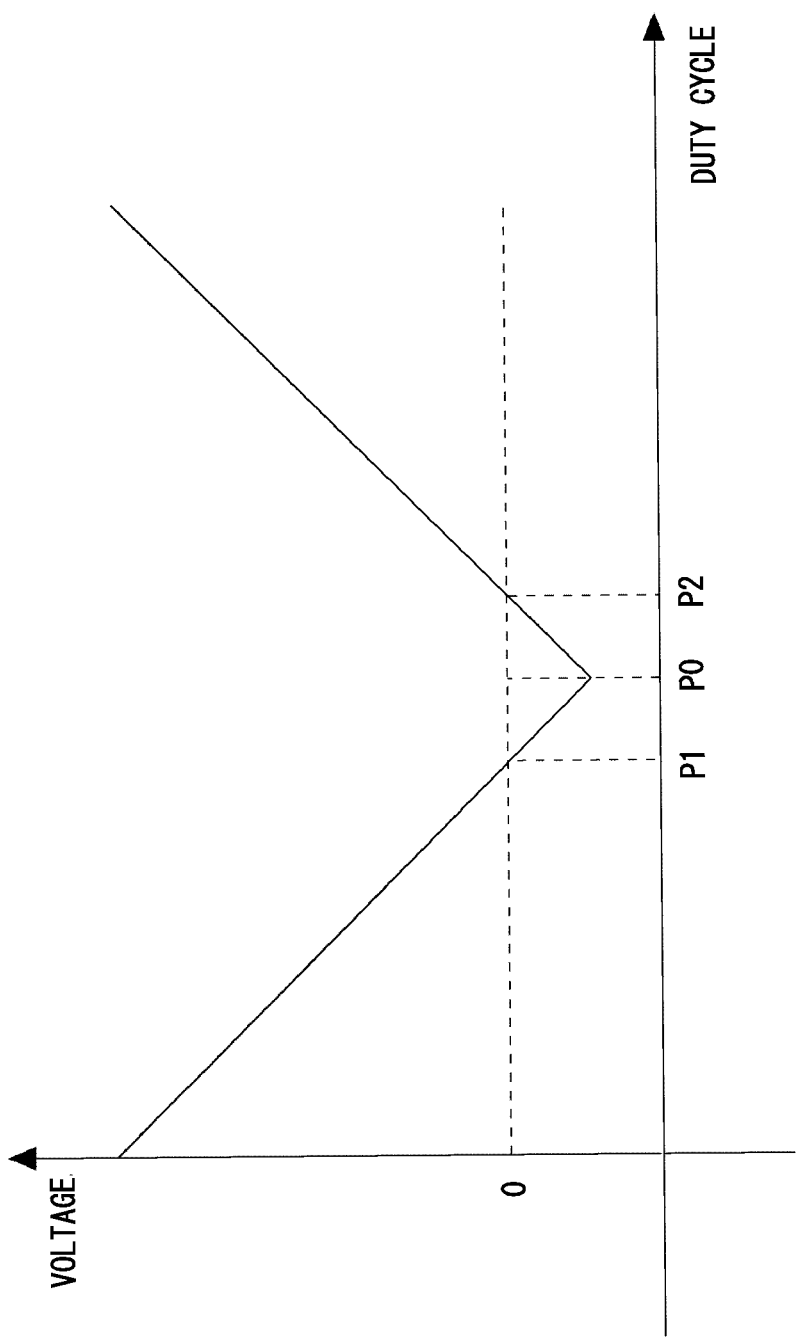
FIG. 5 is a diagram showing the relationship between the duty ratio of the amplifier and the voltage of a second harmonic after detection.

The semiconductor apparatus 100 detects the even-order harmonic signals including the second harmonic, and searches for the duty ratio with which the amplitude of the second harmonic becomes a minimum. Here, an exemplary search is described with reference to FIG. 5. FIG. 5 is a diagram showing the duty ratio of the amplifier and the voltage of the second harmonic after detection. In FIG. 5, the horizontal axis represents the duty ratio of the class-D amplifier of the AC output circuit 101, and the vertical axis represents the amplitude of the second harmonic obtained by the detection carried out by the detector circuit 104.

As shown in FIG. 5, the voltage of the second harmonic after detection becomes a minimum at the point where the duty ratio is P0, similarly to the amplitude level of the second harmonic before detection as shown in FIG. 4. Further, the voltage of the signal after detection becomes symmetric with reference to the point where the duty ratio is P0.

The control circuit 105 searches for the duty ratio with which the voltage of the signal after detection becomes a minimum from the relationship between the duty ratio and the voltage of the second harmonic after detection shown in FIG. 5. The point where the voltage of the signal after detection becomes a minimum may be simply determined. Alternatively, the point where the voltage of the signal after detection becomes minimum may be determined by obtaining the midpoint between the duty ratios which are equal to each other in the voltage of the signal after detection. In FIG. 5, a duty ratio P1 and a duty ratio P2 where the voltage of the signal after detection becomes equal to 0 V being the threshold voltage are searched for, and P0 being the midpoint is obtained from the equation P0=(P1+P2)/2. Note that, the threshold voltage is not necessarily 0 V, and may be an arbitrary voltage. When the threshold value is VCMP_REF, the two duty ratios D1 and D2 providing VLPF_O=VCMP_REF are respectively represented by Mathematical Expression (15) and Mathematical Expression (16).

$$D1 = \frac{1}{2\pi}\arcsin(-\pi \cdot \text{VCMP\_REF}) \quad \text{Mathematical Expression (15)}$$

$$D2 = \frac{1}{2\pi}\arcsin(\pi \cdot \text{VCMP\_REF}) \quad \text{Mathematical Expression (16)}$$

Here, when the midpoint between D1 and D2 is Dc=0.5× (D1+D2), Mathematical Expression (17) is derived.

$$Dc = \frac{1}{4\pi} \cdot \{\arcsin(-\pi \cdot \text{VCMP\_REF}) + \arcsin(\pi \cdot \text{VCMP\_REF})\} = 0.5 \quad \text{Mathematical Expression (17)}$$

In Mathematical Expression (17), by the restriction of 0<{Dc, D1, D2}<1, Dc=0.5 is the solution. The optimum point may be searched for by controlling the variables relating to the duty ratio using a digital bit such as TXDUTY_P/N.

Figure 6:
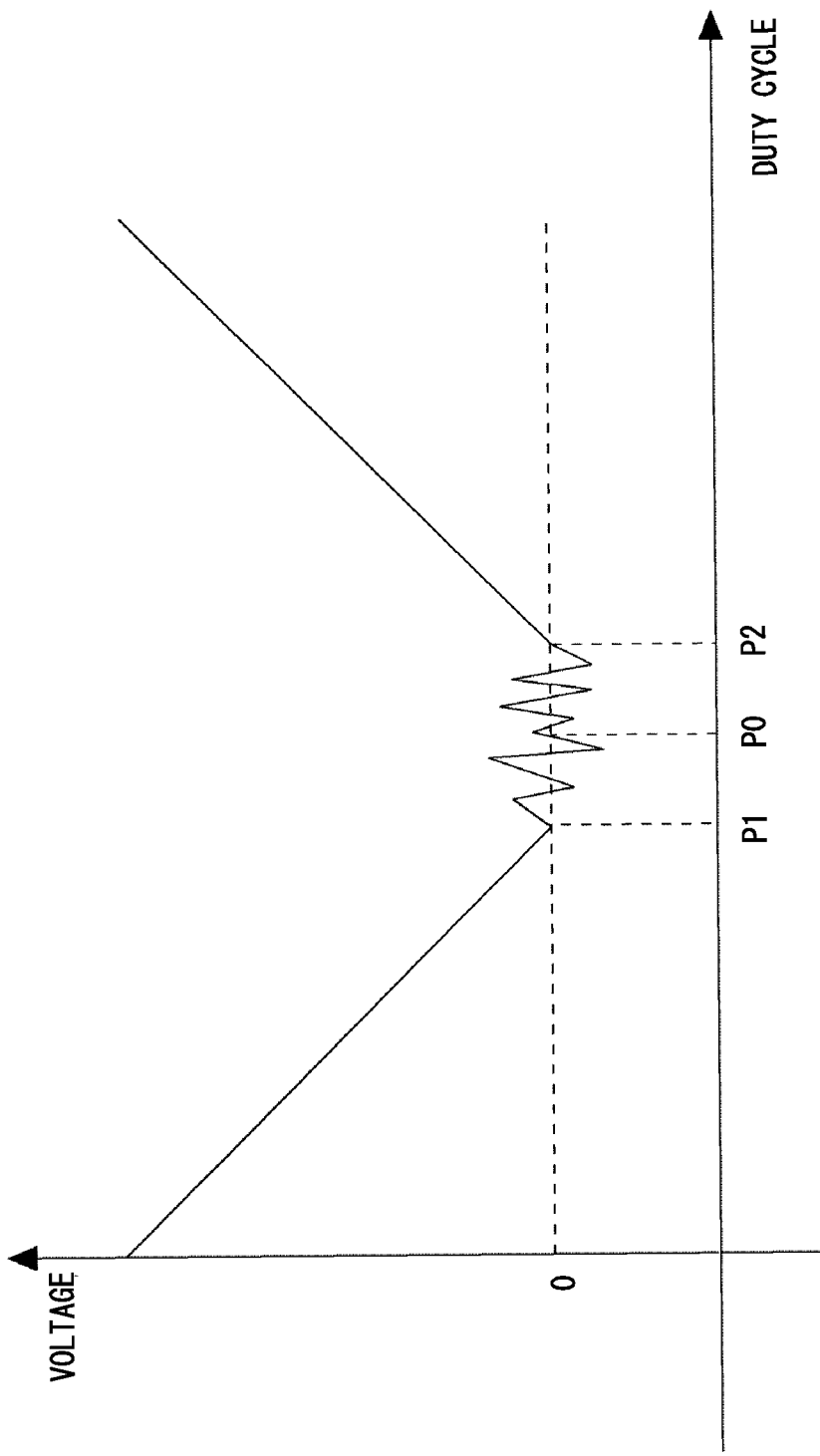
FIG. 6 is a diagram showing the relationship between the duty ratio of the amplifier and the voltage of the second harmonic after detection.

The method of obtaining the optimum duty ratio by the midpoint is advantageous in that the method is little influenced by noise. For example, when the level of detecting the second harmonic is low, the low voltage portion in the detected signal is lost in noise by the influence of the noise floor. FIG. 6 is a diagram showing the relationship between the duty ratio of the amplifier and the voltage of the second harmonic after detection. Similarly to FIG. 5, in FIG. 6, the horizontal axis represents the duty ratio of the class-D amplifier of the AC output circuit 101, and the vertical axis represents the amplitude of the second harmonic obtained by the detection carried out by the detector circuit 104.

In FIG. 6, near the duty ratio P0, the signal is lost in noise. Accordingly, by the method of searching for the point where the voltage is a minimum, such a minimum point is lost in noise and cannot be found.

On the other hand, according to the method for obtaining the optimum duty ratio by the midpoint between the two points where a prescribed voltage is attained, the optimum duty ratio can be found without being influenced by noise, because the duty ratio is calculated from the part of the signal not lost in noise.

Further, the semiconductor apparatus according to the first embodiment exhibits an effect that the optimum duty ratio can be found without being influenced by the offset voltage in the signal voltage.

Figure 7:
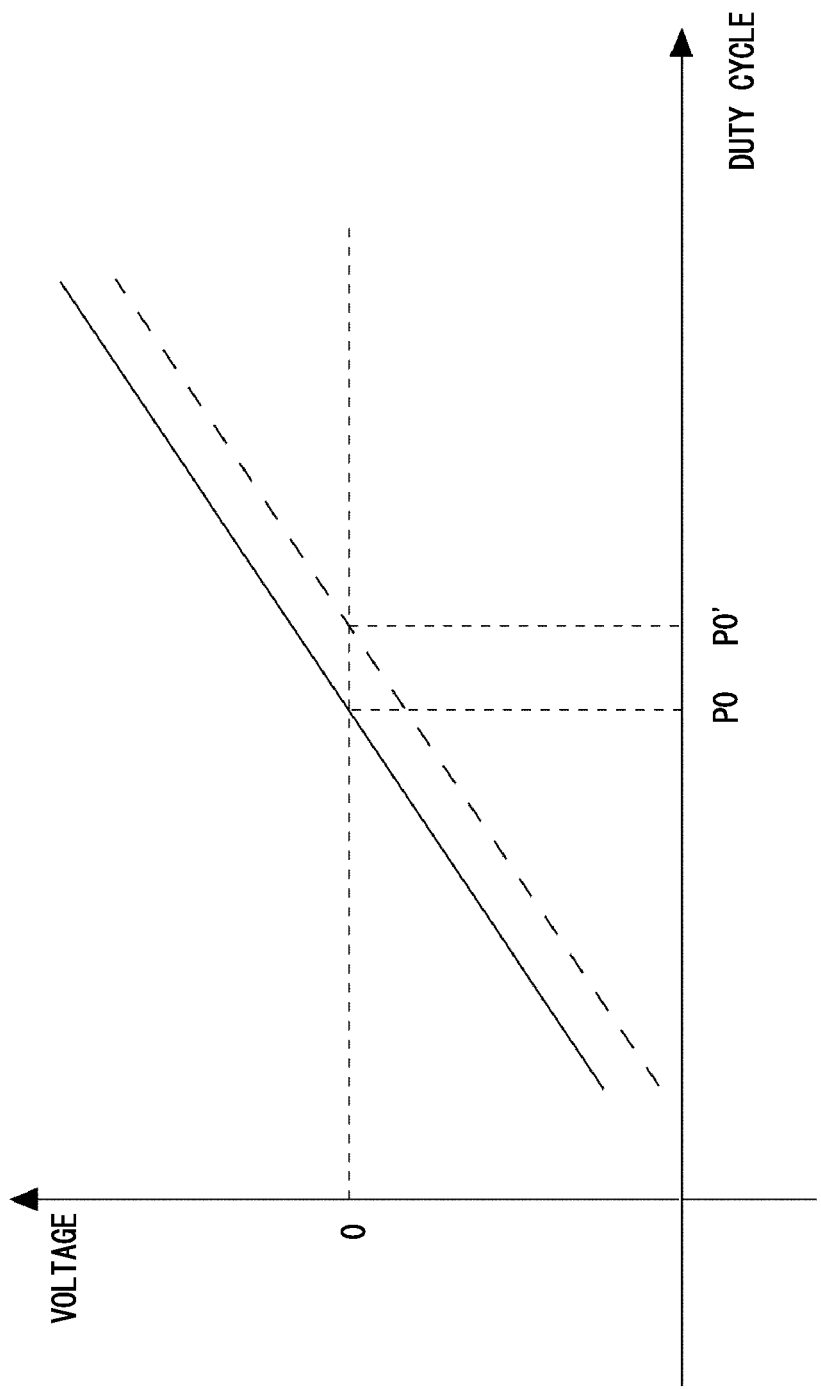
FIG. 7 is a diagram showing the relationship between the duty ratio of the amplifier and a DC signal after common mode detection.

For example, it may be possible to obtain the optimum duty ratio from the DC component out of the signals amplified by the AC output circuit 101. FIG. 7 is a diagram showing the relationship between the duty ratio of the amplifier and the DC signal after common mode detection. As shown in FIG. 7, since the duty ratio of the amplifier and the DC signal after common mode detection are in the linear relationship, the optimum duty ratio is obtained by searching for the point where a prescribed threshold voltage (e.g., 0 V) is reached.

However, in the case where the offset voltage is introduced in the DC signal by the variations in the components structuring the apparatus, as represented by the inclined broken line, the duty ratio where the voltage is 0 V becomes P0'. Thus, the point that is not P0 being the optimum duty ratio may be mistakenly recognized as the optimum duty ratio.

Figure 8:
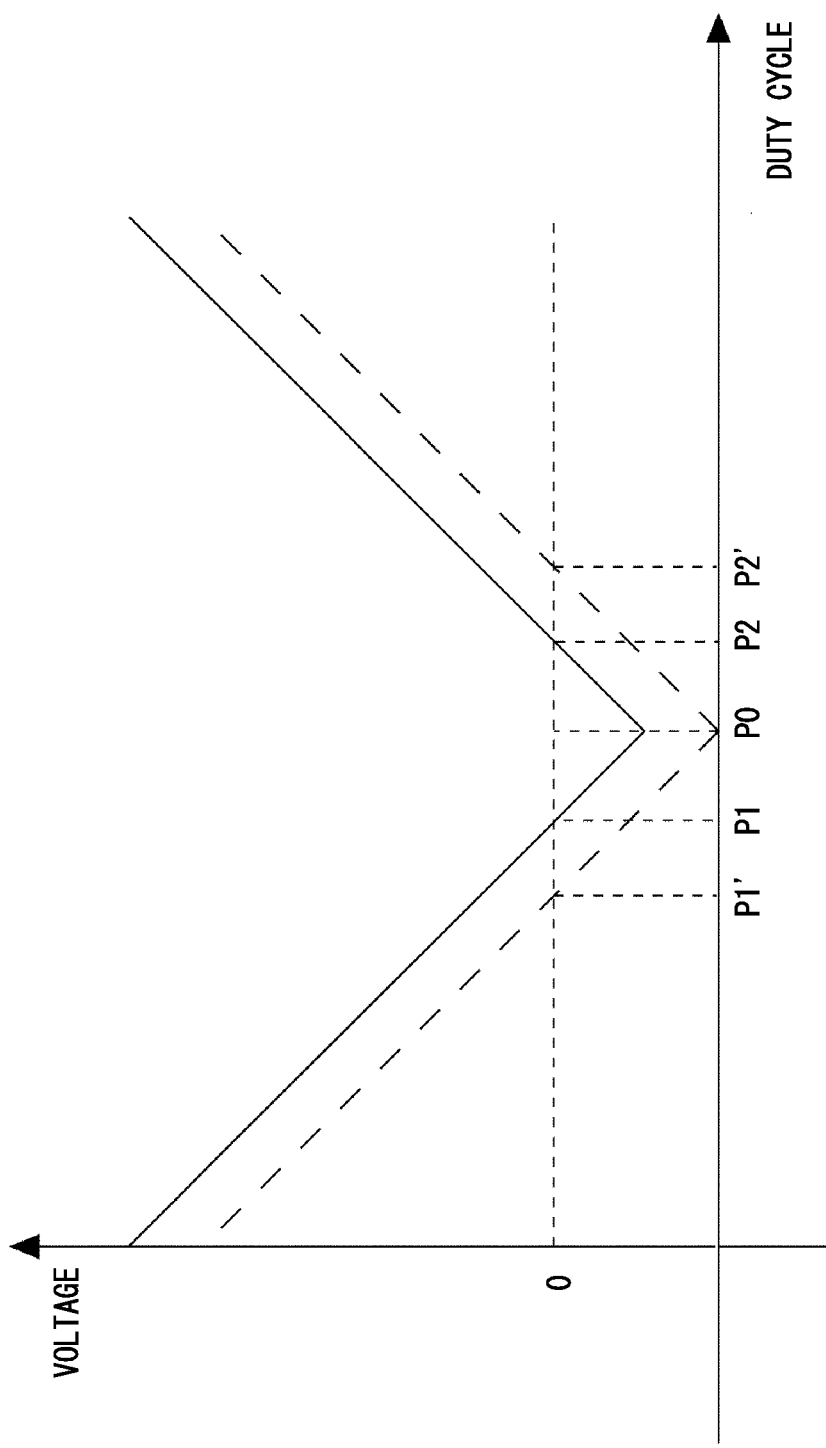
FIG. 8 is a diagram showing the relationship between the duty ratio of the amplifier and the voltage of the second harmonic after detection.

On the other hand, with the semiconductor apparatus according to the first embodiment, the optimum duty ratio can be obtained even when the offset voltage is introduced in the signal, because the second harmonic has the line-symmetric characteristic relative to the optimum duty ratio. FIG. 8 is a diagram showing the relationship between the duty ratio of the amplifier and the voltage of the second harmonic after detection. Similarly to FIGS. 5 and 6, in FIG. 8, the horizontal axis represents the duty ratio of the class-D amplifier of the AC output circuit 101, and the vertical axis represents the amplitude of the second harmonic obtained by the detection carried out by the detector circuit 104. In FIG. 8, the broken line shows the signal after detection with an introduction of the offset voltage. By the offset voltage, the points where the voltage becomes equal to the threshold value 0 V shift to P1' and P2'. However, since the midpoint between P1 and P2 is P0 which is similarly the midpoint between P1' and P2', the optimum duty ratio can be determined.

Figure 9:
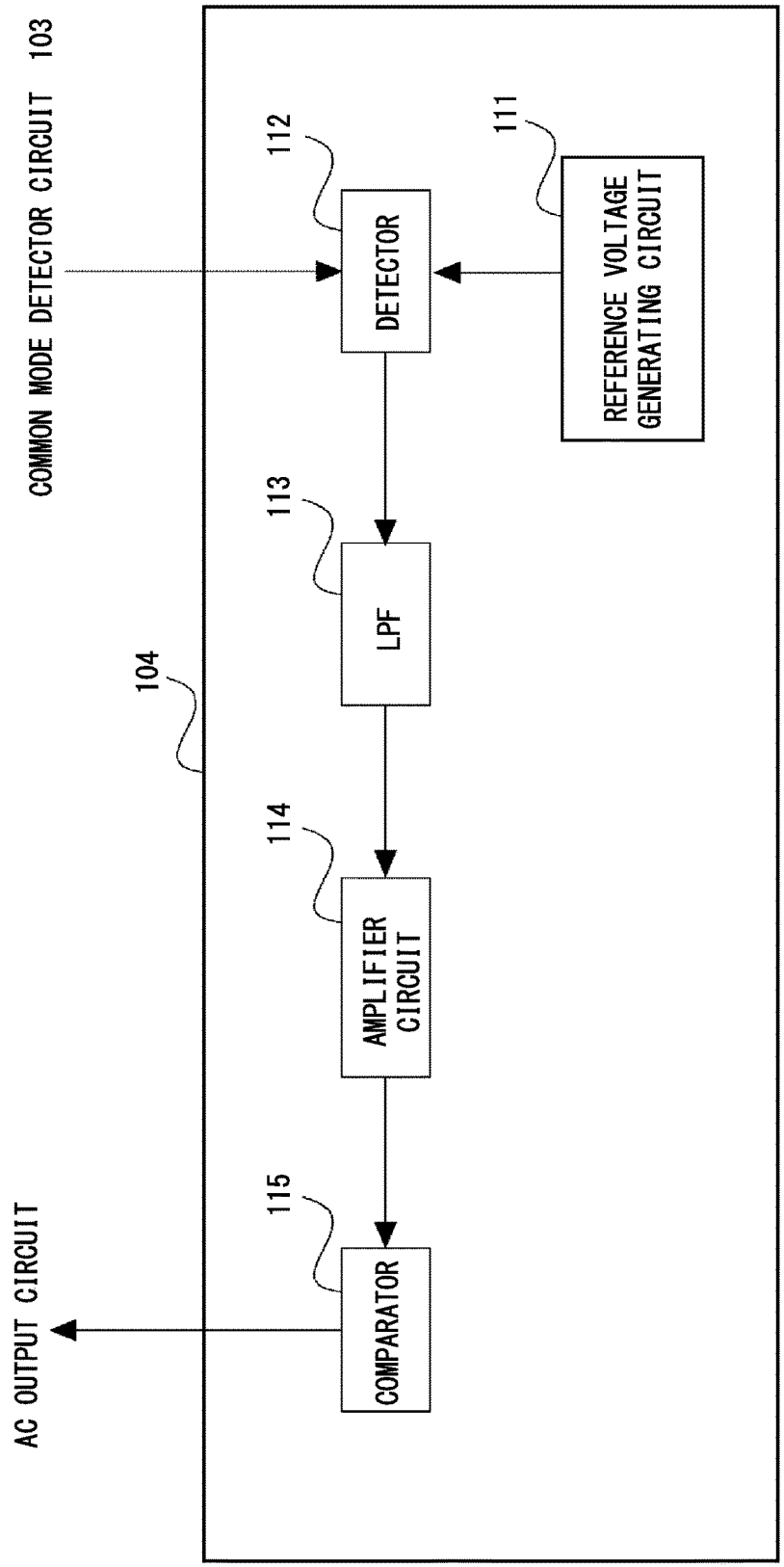
FIG. 9 is a block diagram showing the configuration of the detector circuit according to the first embodiment.

Next, a description will be given of the internal configuration of the detector circuit 104 according to the first embodiment. FIG. 9 is a block diagram showing the configuration of the detector circuit according to the first embodiment. In FIG. 9, the detector circuit 104 includes a reference voltage generating circuit 111, a detector 112, an LPF 113, an amplifier circuit 114, and a comparator 115.

The reference voltage generating circuit 111 generates reference voltages used by the detector 112. For example, the reference voltage generating circuit 111 generates two types of reference voltages, namely, a reference voltage VREF1 and a reference voltage VREF2. By the differential voltage between the reference voltage VREF1 and the reference voltage VREF2, the amplitude level of the second harmonic to be detected is determined. That is, the voltage corresponding to P1 and P2 in FIG. 5 is determined by the differential voltage between the voltage VREF1 and the voltage VREF2.

The detector 112 adds the voltage VREF2 to the signal obtained by the common mode detection carried out by the common mode detector circuit 103, and detects the resultant signal as well as the voltage VREF1. Thus, the detector 112 obtains a DC signal whose DC voltage is the amplitude level of the second harmonic signal obtained by the common mode detection. Then, the detector 112 outputs the obtained amplitude level to the LPF 113.

The LPF 113 suppresses the high-frequency component contained in the DC signal of the obtained amplitude level, and outputs the signal to the amplifier circuit 114.

The amplifier circuit 114 amplifies the DC signals, and outputs the amplified signals to the comparator 115.

The comparator 115 compares the voltages of the amplified DC signals against each other. The difference between the voltages of the two signals being the comparison targets reflects the amplitude level of the second harmonic signal and the difference between the two reference voltages. As described above, by the differential voltage between the reference voltage VREF1 and the reference voltage VREF2, the voltage corresponding to P1 and P2 in FIG. 5 is determined. That is, the comparator 115 outputs the result as to whether the voltage of the signal obtained by detecting the second harmonic signal is higher or lower than a prescribed voltage.

The control circuit 105 varies the duty ratio in pulse width modulation carried out by the class-D amplifier of the AC output circuit 101, and detects, as P1 or P2 in FIG. 5, the duty ratio at the point where the result of the comparator 115 changes. Then, the control circuit 105 employs the midpoint P0 between P1 and P2 as the optimum duty ratio, and reflects it on the duty ratio in pulse width modulation carried out by the class-D amplifier of the AC output circuit 101.

Figure 10:
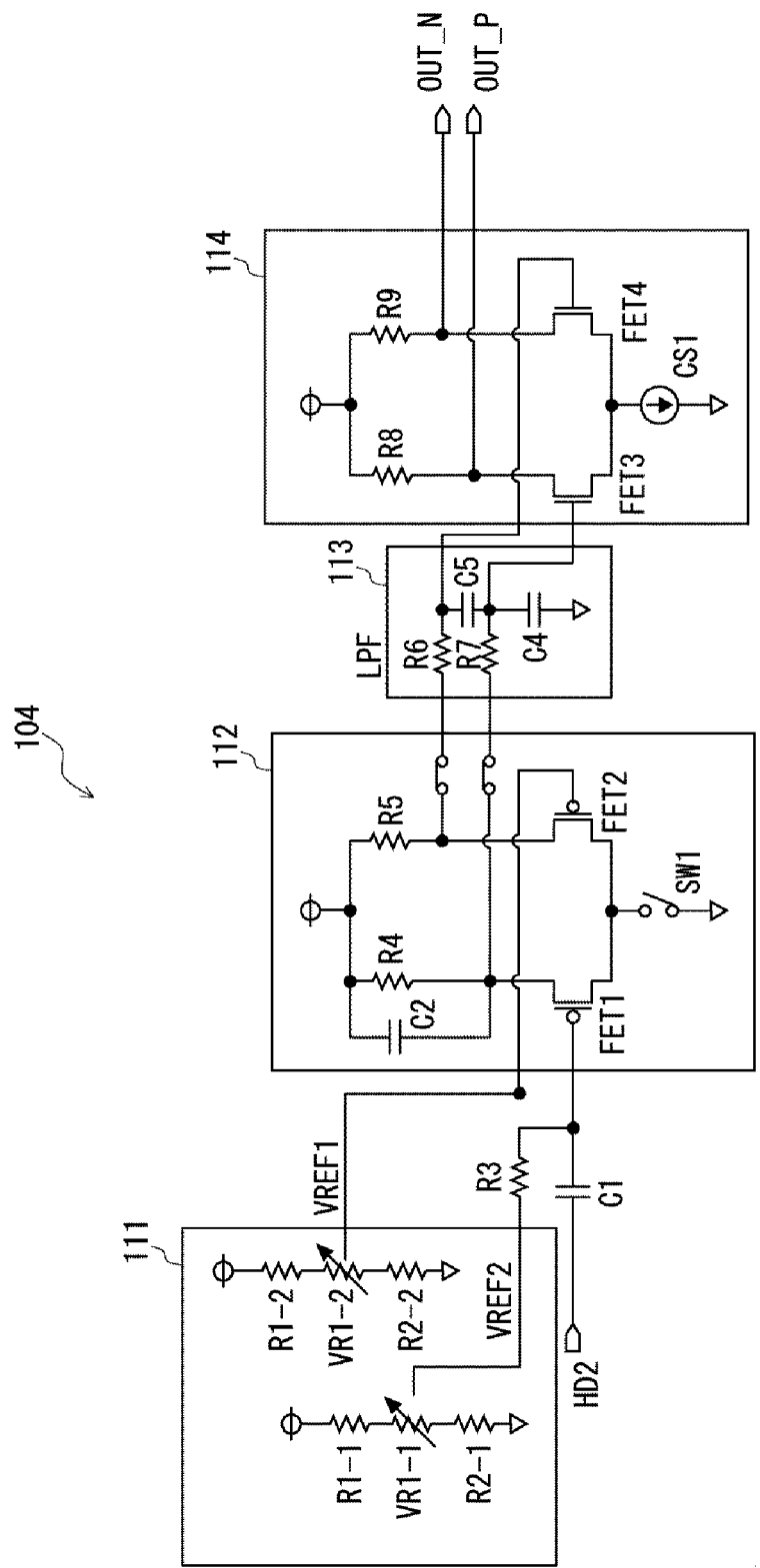
FIG. 10 is a circuit diagram showing the configuration of the detector circuit according to the first embodiment.

Next, a description will be given of an exemplary specific circuit of the detector circuit 104 according to the first embodiment. FIG. 10 is a circuit diagram showing the configuration of the detector circuit according to the first embodiment.

The detector circuit 104 includes resistors R1-1, R1-2, R2-1, R2-2, R3, R4, R5, R6, R7, R8, and R9, capacitors C1, C2, C3, C4, field-effect transistors FET1, FET2, FET3, and FET4, variable resistors VR1-1 and VR1-2, a switch SW1, and a current source CS1. The field-effect transistors FET1 and FET2 are, for example, pMOS-FETs, and the field-effect transistors FET3 and FET4 are, for example, nMOS-FETs. The switch SW1 enables detection by closing, and disables detection by opening.

In FIG. 10, between the power supply potential and the ground potential, the resistor R1-1, the fixed resistor of the variable resistor VR1-1, and the resistor R2-1 are connected in series. Between the variable resistor terminal of the variable resistor VR1-1 and the gate of the field-effect transistor FET1, the resistor R3 is connected. Further, between the power supply potential and the ground potential, the resistor R1-2, the fixed resistor of the variable resistor VR1-2, and the resistor R2-2 are connected in series. The variable resistor terminal of the variable resistor VR1-2 and the gate of the field-effect transistor FET2 are connected to each other. Further, the capacitor C1 is connected between the input terminal of the second harmonic and the field-effect transistor FET1.

In connection with the circuit configuration of the detector 112, between the power supply potential and source of the field-effect transistor FET1, the resistor R4 and the capacitor 2 are connected in parallel. Further, the resistor R5 is connected between the power supply potential and the field-effect transistor FET2. Between drain of the field-effect transistor FET1 as well as drain of the field-effect transistor FET2 and the ground potential, the switch SW1 is connected.

The LPF 113 includes the resistors R6 and R7 and the capacitors C3 and C4. Then, between source of the field-effect transistor FET2 and gate of the field-effect transistor FET4, the resistor R6 is connected. Further, between source of the field-effect transistor FET1 and gate of the field-effect transistor FET3, the resistor R7 is connected. Further, between the terminal of the resistor R6 on the amplifier circuit 114 side and the terminal of the resistor R7 on the amplifier circuit 114 side, the capacitor C3 is connected. Further, between the terminal of the resistor R7 on the amplifier circuit 114 side and the ground potential, the capacitor C4 is connected.

In connection with the circuit configuration of the amplifier circuit 114, between the power supply potential and source of the field-effect transistor FET3, the resistor R8 is connected. Further, between the power supply potential and source of the field-effect transistor FET4, the resistor R9 is connected. Between drain of the field-effect transistor FET3 and the ground potential, the current source is connected. Further, between drain of the field-effect transistor FET4 and the ground potential, the current source is connected. Then, source of the field-effect transistor FET3 and source of the field-effect transistor FET4 are respectively connected to the output terminals.

Next, a description will be given of signal processing carried out by the detector circuit 104.

Figure 11:
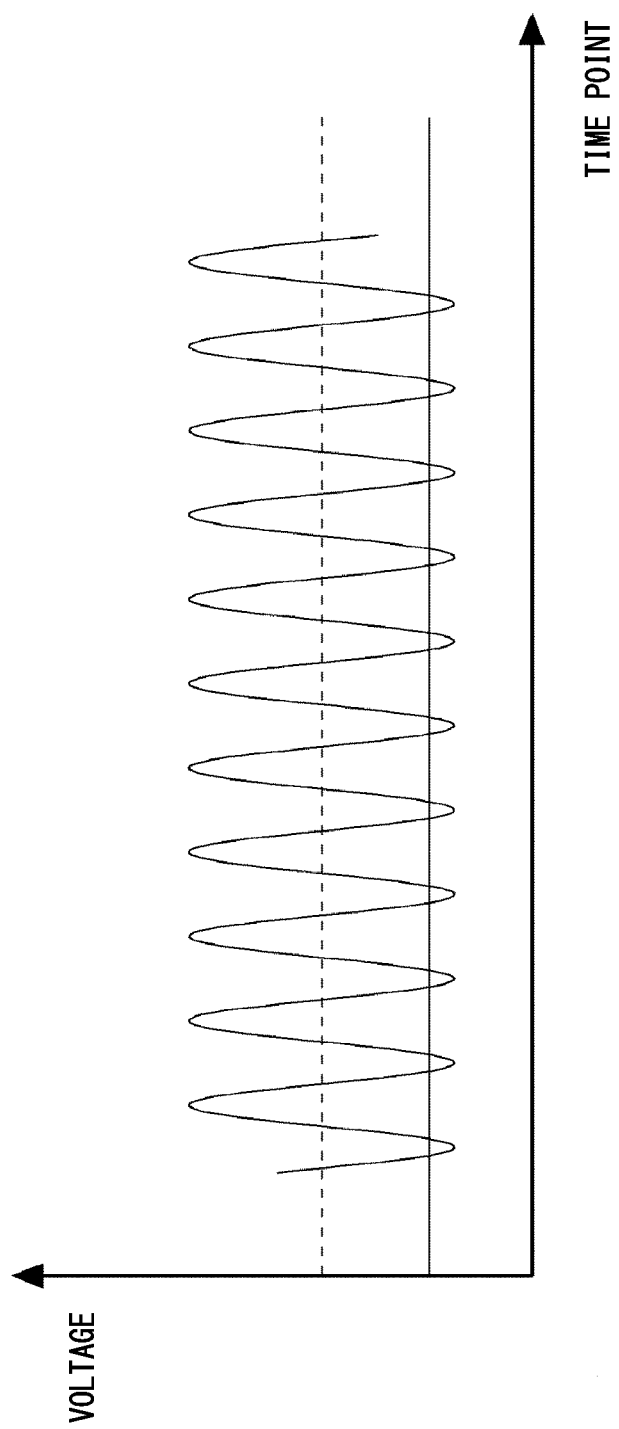
FIG. 11 is a diagram showing signals input to a detector 112.

A second harmonic HD2 input from the input terminal has its DC component suppressed by the capacitor C1. Then, a signal obtained by adding the reference voltage VREF2 to the second harmonic HD2 having its DC component suppressed is input to gate of the field-effect transistor FET1. Further, a signal of the reference voltage VREF1 is input to gate of the field-effect transistor FET2. FIG. 11 is a diagram showing the signals input to the detector 112. In FIG. 11, the vertical axis represents the voltage, and the horizontal axis represents the time point. Further, in FIG. 11, the broken line represents the signal of the reference voltage VREF2, and the solid lines represent the signals being the detection targets. As shown in FIG. 11, the detector 112 receives the signal obtained by adding the reference voltage VREF2 to the second harmonic HD2, and the signal of the reference voltage VREF1.

Figure 12:
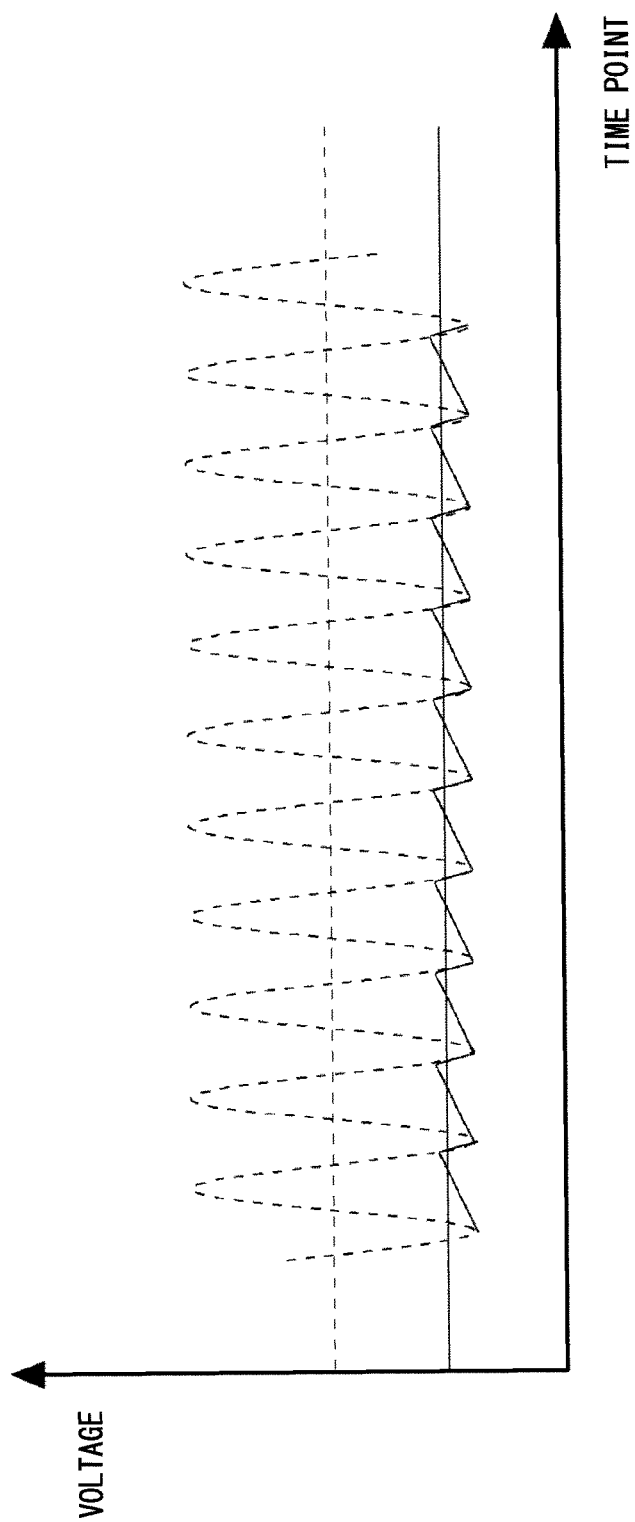
FIG. 12 is a diagram showing detected signals.

In the detector 112, the signal obtained by adding the reference voltage VREF2 to the second harmonic HD2 is subjected to detection, whereby a signal in which the amplitude of the second harmonic HD2 is converted to the DC voltage is obtained. Here, assuming that the differential voltage between the two reference voltages is Vrf, and that the voltage of the signal obtained by detecting the amplitude level of the second harmonic is VDC1, the detection potential obtained at source of the field-effect transistor FET1 can be derived by Vo2=VDC1+Vrf. Further, assuming that the detection potential obtained at source of the field-effect transistor FET2 is Vo1=VDC, in the potential difference between the field-effect transistors FET1 and FET2, the amplitude level of the second harmonic satisfies the relationship of ΔVd=VDC1−VDC. FIG. 12 is a diagram showing the signals after detection. In FIG. 12, the vertical axis represents the voltage, and the horizontal axis represents the time point. Further, in FIG. 12, the broken lines represent the signals of the reference voltage VREF2 and the signal before detection, and the solid lines represent signals after detection. As shown in FIG. 12, the AC component remains in part of the signals after detection.

Figure 13:
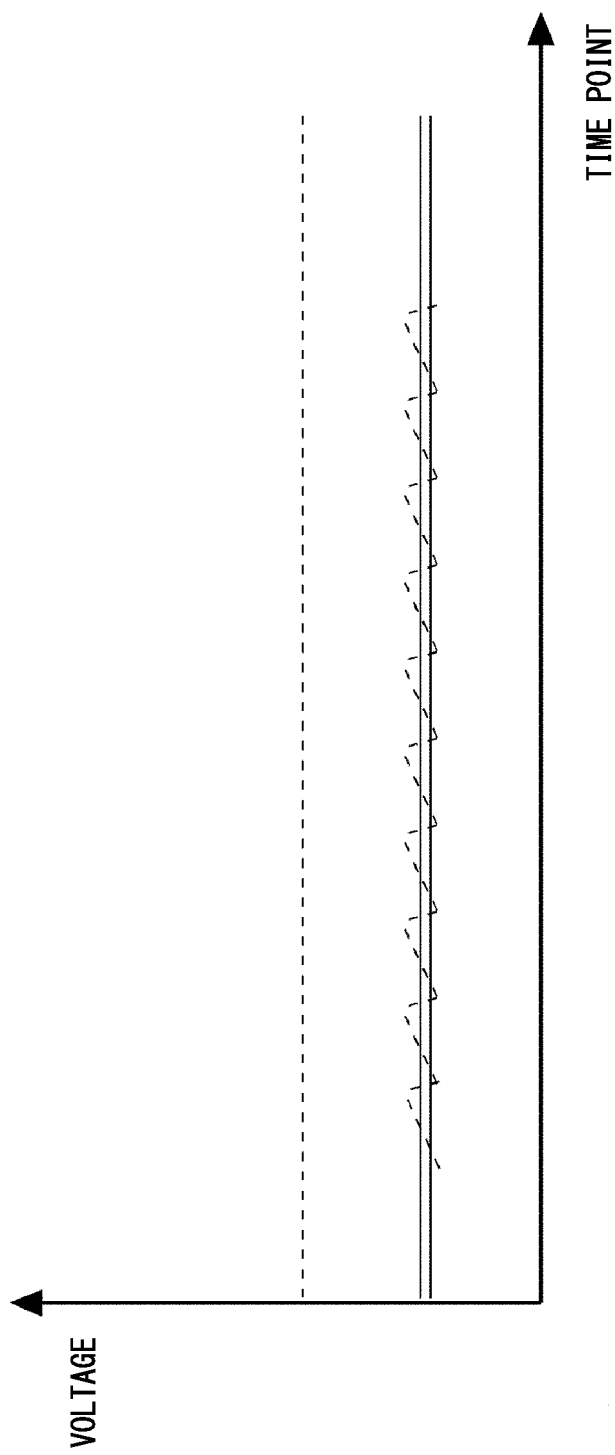
FIG. 13 is a diagram showing exemplary signals after having an AC component suppressed.

The LPF 113 suppresses the AC component in the signal after detection. FIG. 13 is a diagram showing exemplary signals after having the AC component suppressed. In FIG. 13, the vertical axis represents the voltage, and the horizontal axis represents the time point. Further, in FIG. 13, the broken lines represent the signal of the reference voltage VREF2 and the AC component, and the solid lines represent the signals after having the AC component suppressed. Then, after being passed through the LPF 113, the potentials of the voltages are Vo2'=VDC1+a×Vrf, Vo1'=VDC. Here, a is a prescribed constant.

Figure 14:
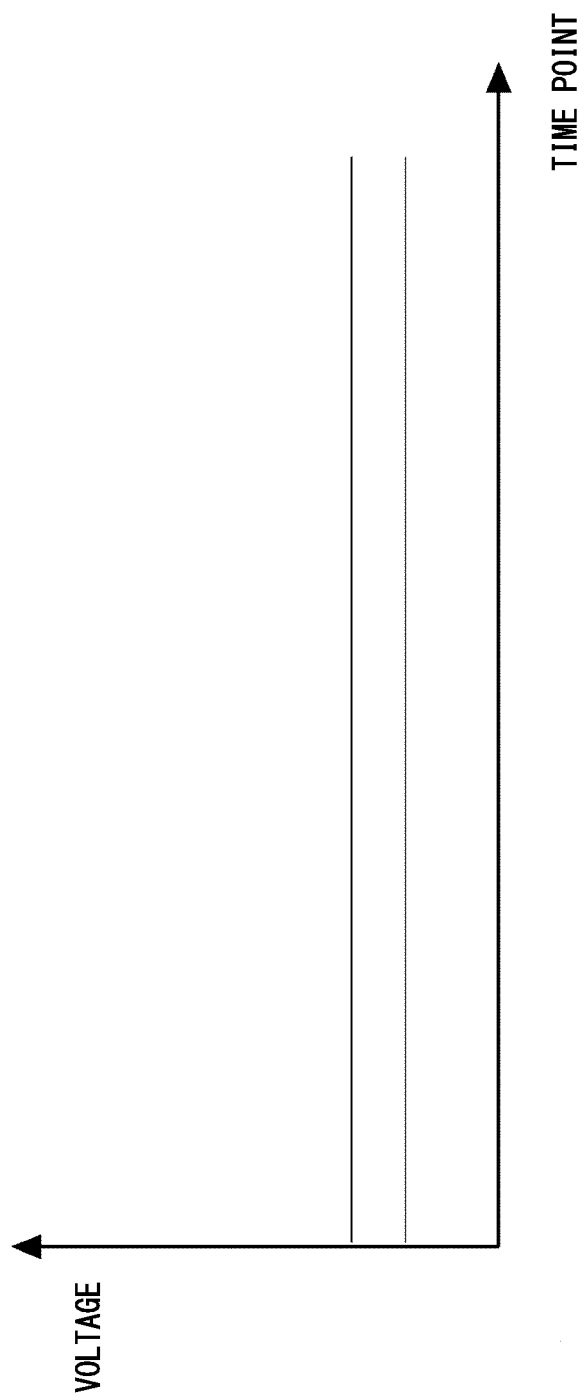
FIG. 14 is a diagram showing exemplary amplified signals.

Then, the amplifier circuit 114 amplifies the signals after having the AC component suppressed. FIG. 14 shows the exemplary amplified signals. In FIG. 14, the vertical axis represents the voltage, and the horizontal axis represents the time point. Further, in FIG. 14, the solid lines represent the amplified signals. Then, the potential difference of the signals output from the amplifier circuit 114 is V(OUT_N)−V(OUT_P)=Av×(ΔVd+a×Vrf). Here, Av is the amplification rate of the amplifier circuit 114. The potential difference between the two signals means the difference between the voltage representing the amplitude of the second harmonic HD2 and the voltage being the threshold value.

Accordingly, when the comparator 115 determines that the voltages of the two signals are equal to each other, it means that the voltage representing the amplitude of the second harmonic HD2 is equal to the threshold value. Based on the comparison result, the duty ratios P1 and P2 where the voltage of the signal after detection becomes equal to the threshold value are searched for. From the equation P0=(P1+P2)/2, P0 being the midpoint can be obtained as the optimum duty ratio.

As to the determination timing of the optimum duty ratio, the control circuit 105 varies the duty ratio to sweep the possible range of the duty ratio in a prescribed period, e.g., when the operation is stabilized after power-on. Then, from the relationship between the output of the comparator 115 and the duty ratio, the control circuit 105 searches for the duty ratios P1 and P2 where the voltage of the second harmonic signal after detection becomes equal to the voltage being the threshold value. Then, the control circuit 105 sets the duty ratio of the AC output circuit 101, by employing P0 being the midpoint between P1 and P2 as the optimum duty ratio. By the foregoing operation, calibration for obtaining the optimum duty ratio of the AC output circuit 101 can be executed.

As described above, according to the first embodiment, AC signals output from the AC output circuit are detected in the common mode. The amplitude level of harmonics is obtained by detecting the even-order harmonics of the signal obtained by the common mode detection. Thus, the AC output circuit can be controlled in order to suppress the amplitude level of the harmonics.

Second Embodiment

In the following, a description will be given of a second embodiment with reference to the drawings. In the first embodiment, the second harmonic signal after detection is output to the amplifier circuit via the LPF. On the other hand, in the present embodiment, the connection line of the detector and that of the amplifier circuit are connected via a capacitor.

Figure 15:
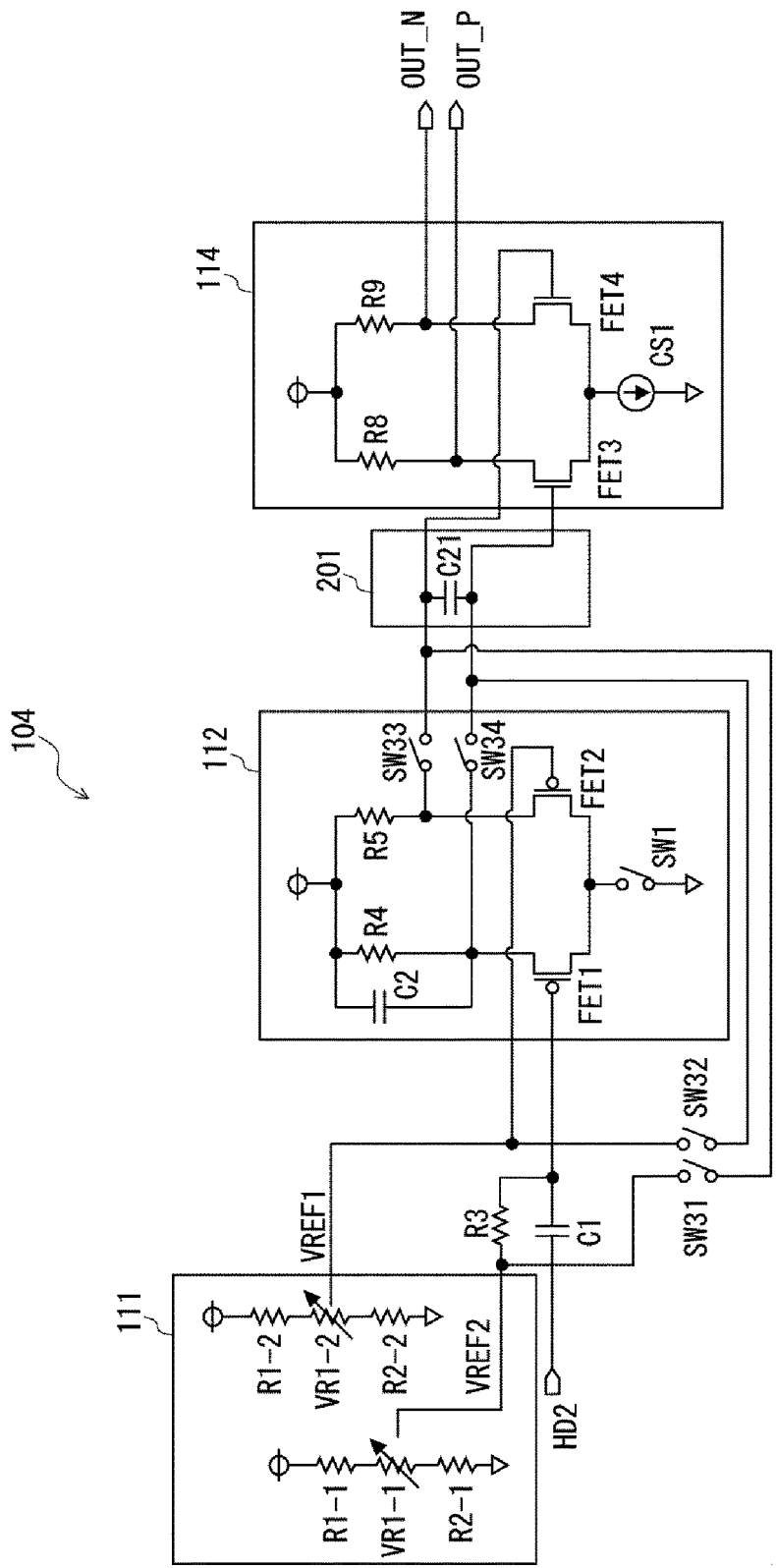
FIG. 15 is a circuit diagram showing the configuration of a detector circuit according to a second embodiment.

FIG. 15 is a circuit diagram showing the configuration of a detector circuit according to the second embodiment. The elements similar to those of the first embodiment are denoted by identical reference characters, and the description thereof will not be repeated.

In FIG. 15, a capacitance connection circuit 201 includes a capacitor C21. Then, the capacitor C21 is connected between the line connecting source of the field-effect transistor FET1 and gate of the field-effect transistor FET3 and the line connecting source of the field-effect transistor FET2 and gate of the field-effect transistor FET4.

Figure 16:
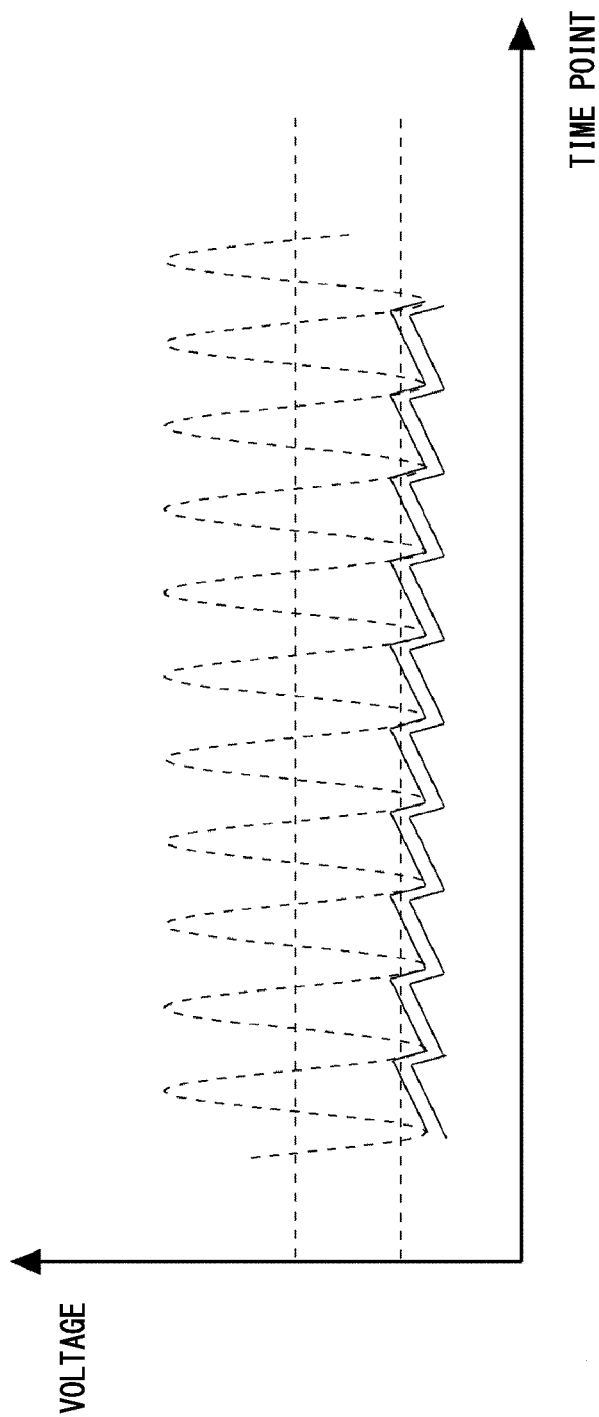
FIG. 16 is a diagram showing exemplary signals input to an amplifier circuit 114.

The insertion of the capacitor makes the connection lines between the detector 112 and the amplifier circuit 114 equivalent to be short-circuiting in an AC mode. The high-frequency component that originally exists only in one of the signals whose harmonic has been detected is introduced also in the reference voltage signal by the same level, and the signals are input to the amplifier circuit 114. FIG. 16 shows exemplary signals being input to the amplifier circuit 114. In FIG. 16, the vertical axis represents the voltage, and the horizontal axis represents the time point. Further, in FIG. 16, the broken lines represent signals before detection, and the solid lines represent signals on both of which the high-frequency component is reflected by the capacitance connection circuit 201.

As to the high-frequency component, the CMRR (Common Mode Rejection Ratio) of the amplifier circuit 114 is effectively used, and the high-frequency component contained by the same level in each signal is removed at the output of the amplifier circuit 114. The removed amount is determined by the cutoff frequency of the RC filter and the characteristic of the CMRR of the amplifier circuit 114.

With the semiconductor apparatus according to the second embodiment, the harmonic component is removed through use of the CMRR of the amplifier circuit in place of use of the LPF. Therefore, the elements structuring the LPF circuit can be saved. Thus, the effect of reducing the area of the semiconductor apparatus can be expected.

Third Embodiment

In the following, a description will be given of a third embodiment with reference to the drawings. In the first embodiment, the voltage of the second harmonic signal after detection and the threshold voltage are compared against each other using the comparator. On the other hand, in the present embodiment, an analog-digital converter circuit is included, and the potential difference between the voltage of the second harmonic signal after detection and the threshold voltage is converted into a digital signal.

Figure 17:
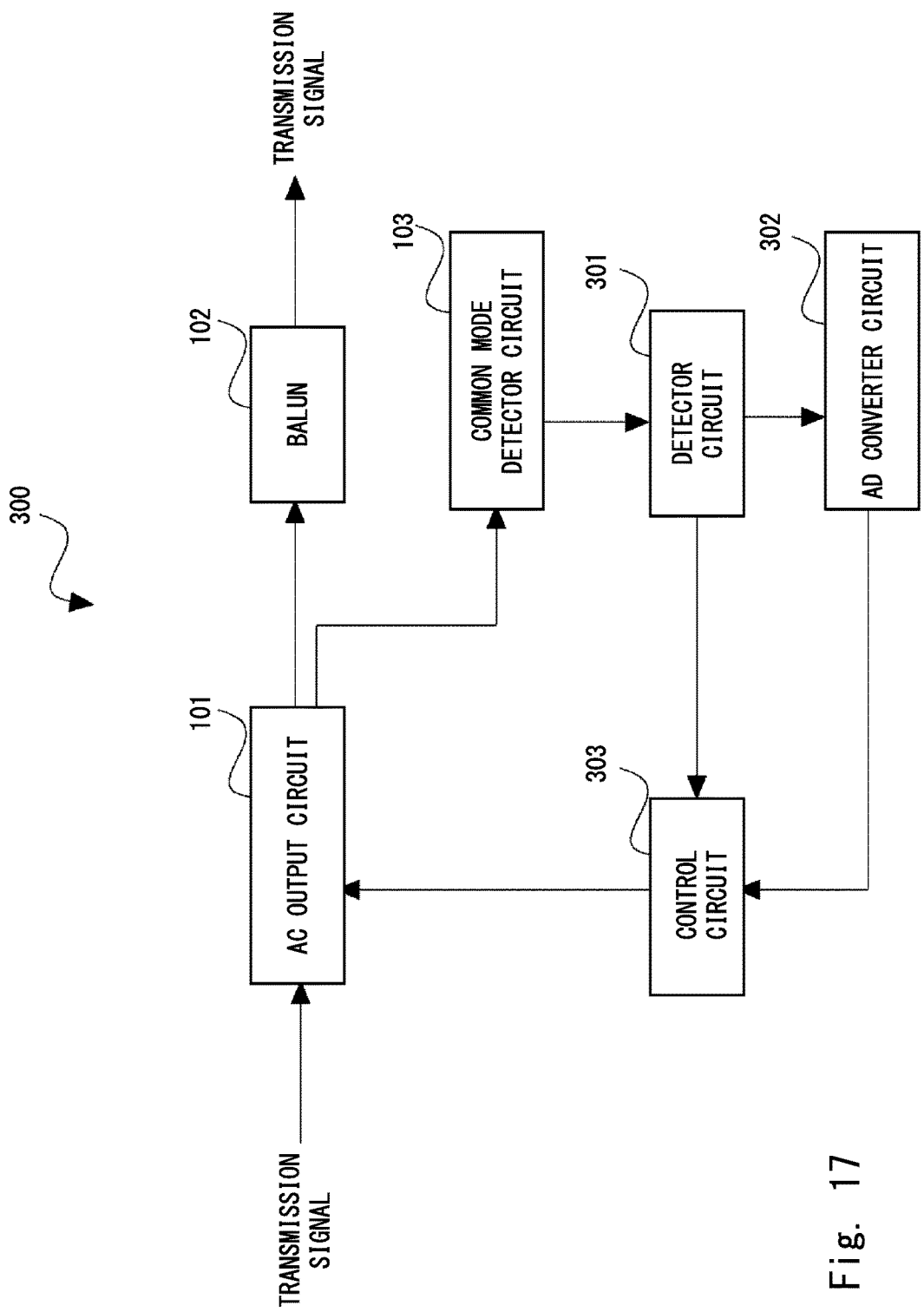
FIG. 17 is a diagram showing the configuration of a semiconductor apparatus according to a third embodiment.

FIG. 17 is a diagram showing the configuration of a semiconductor apparatus according to the third embodiment. The elements similar to those of the first embodiment are denoted by identical reference characters, and the description thereof will not be repeated.

As shown in FIG. 17, a semiconductor apparatus 300 includes a detector circuit 301, an AD converter circuit 302, and a control circuit 303.

The detector circuit 301 detects the signal obtained by the common mode detection, to obtain the amplitude level of even-order harmonics. Then, the detector circuit 301 outputs the detected amplitude level to the control circuit 105. Further, the detector circuit 301 outputs the signal obtained by the common mode detection and a signal of the reference voltage to the AD converter circuit 302.

The AD converter circuit 302 performs analog-to-digital conversion to the potential difference between the signal obtained by the common mode detection and the signal of the reference voltage, and outputs the converted digital signal to the control circuit 303.

The control circuit 303 controls and determines parameters of the AC output circuit, such that the amplitude level obtained by the detector circuit 301 becomes a minimum. For example, the control circuit 303 varies the duty ratio of the class-D amplifier of the AC output circuit 101 in performing in pulse width modulation, to obtain the relationship between the duty ratio and the amplitude level of the even-order harmonics. Then, the control circuit 303 instructs the AC output circuit 101 about the duty ratio with which the amplitude level of the even-order harmonic becomes a minimum.

Further, the control circuit 303 monitors the variations in the second harmonic, based on the digital signal obtained by the AD converter circuit 302. The operation will be detailed later.

Figure 18:
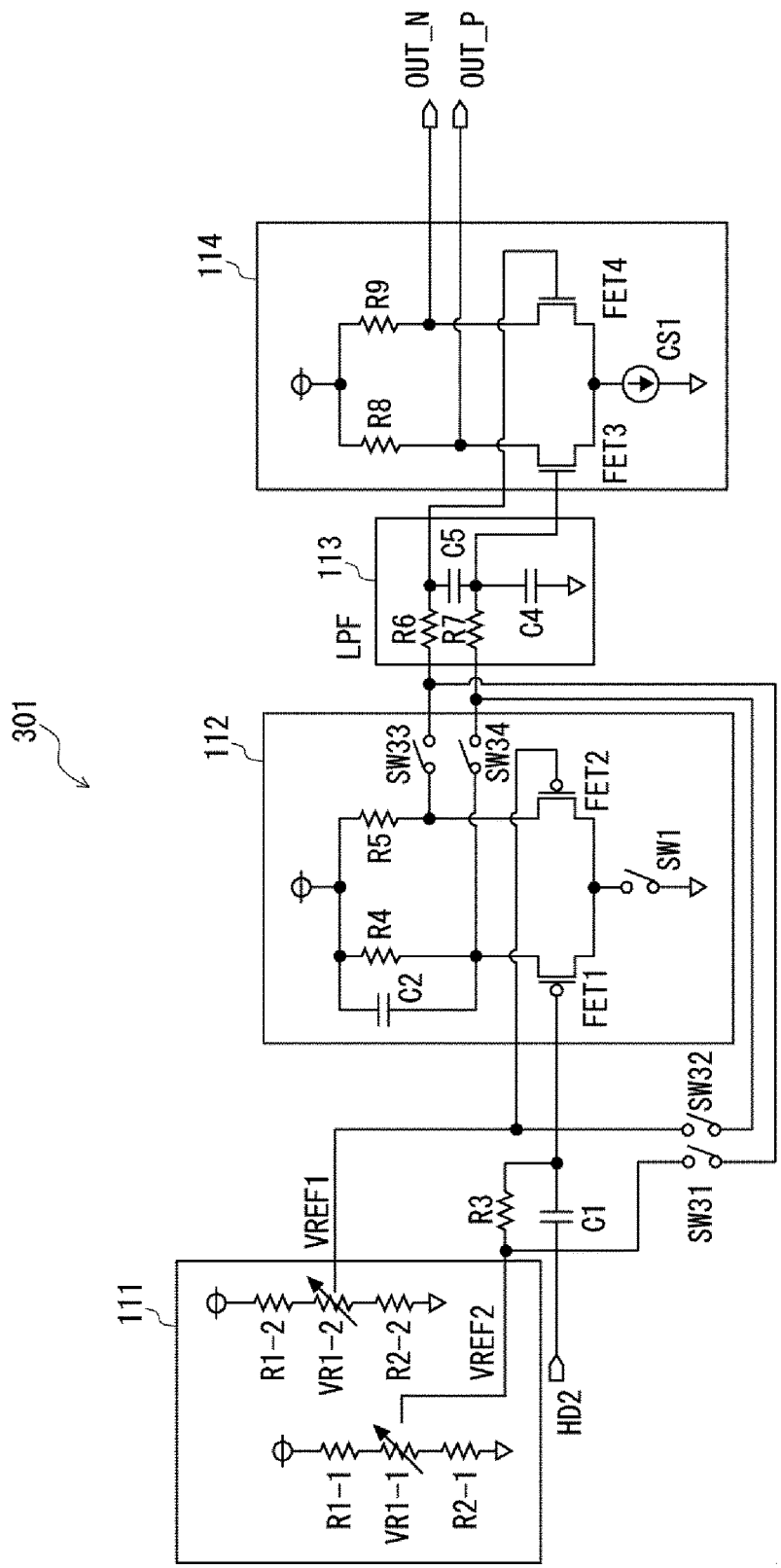
FIG. 18 is a circuit diagram showing the configuration of a detector circuit according to the third embodiment.

Next, a description will be given of the internal configuration of the detector circuit 301. FIG. 18 is a circuit diagram showing the configuration of the detector circuit according to the third embodiment. The elements similar to those of the first embodiment are denoted by identical reference characters, and the description thereof will not be repeated.

In FIG. 18, the detector circuit 301 includes switches SW31, SW32, SW33, and SW34.

As shown in FIG. 18, between the variable resistor terminal of the variable resistor VR1-1 and the resistor R6, the switch SW31 is connected. Further, between the variable resistor terminal of the variable resistor VR1-2 and the resistor R7, the switch SW32 is connected.

Then, between source of the field-effect transistor FET2 and the resistor R6, the switch SW33 is connected. Further, between source of the field-effect transistor FET1 and the resistor R7, the switch SW34 is connected.

SW31 and SW32 open and close in synchronization with each other. Similarly, SW33 and SW34 open and close in synchronization with each other. Further, when SW31 and SW32 are open, SW33 and SW34 are closed, to allow the signals after detection to be input to the LPF 113.

Further, when SW31 and SW32 are closed, SW33 and SW34 are open, to allow the second harmonic signal and the reference voltage signal to be directly input to the LPF 113 bypassing the detector 112.

In the following, the operation will be described. When calibration through use of the second harmonic according to the first or second embodiment has finished, the signal route is switched such that the output of the amplifier circuit 114 is monitored by the AD converter circuit. Here, the signals bypass the detector 112, and the AD converter circuit receives the DC voltage (the $e_1$ component described in the first embodiment) that monotonously varies in accordance with the second harmonic. When the calibration has finished, the output of the amplifier circuit 114 is the voltage (Vopt) with which the second harmonic becomes a minimum, and the output of the amplifier circuit 114 at this time point is temporarily stored in memory. When the second harmonic varies due to any factor (for example, temperatures), the output of the amplifier circuit 114 also varies accordingly. Therefore, one of the following is selected:

(1) duty is adjusted to approximate Vopt.

(2) when the output does not largely deviate from Vopt, the calibration operation is not selected.

The determination criterion as to not largely deviating from Vopt may be the output being at the level of the second harmonic allowed by the Radio Law.

As described above, with the semiconductor apparatus according to the third embodiment, when sharp environment variations occur, the correction time can be reduced by determining, based on the output of the analog-digital converter circuit, whether to again perform correction or not to select the calibration operation according to the extent of variations of the second harmonic.

Fourth Embodiment

In the following, a description will be given of a fourth embodiment with reference to the drawings. In the first embodiment, the optimum duty ratio is searched for using the amplitude level of the second harmonic. On the other hand, in the present embodiment, the phase of the second harmonic is used.

Figure 19:
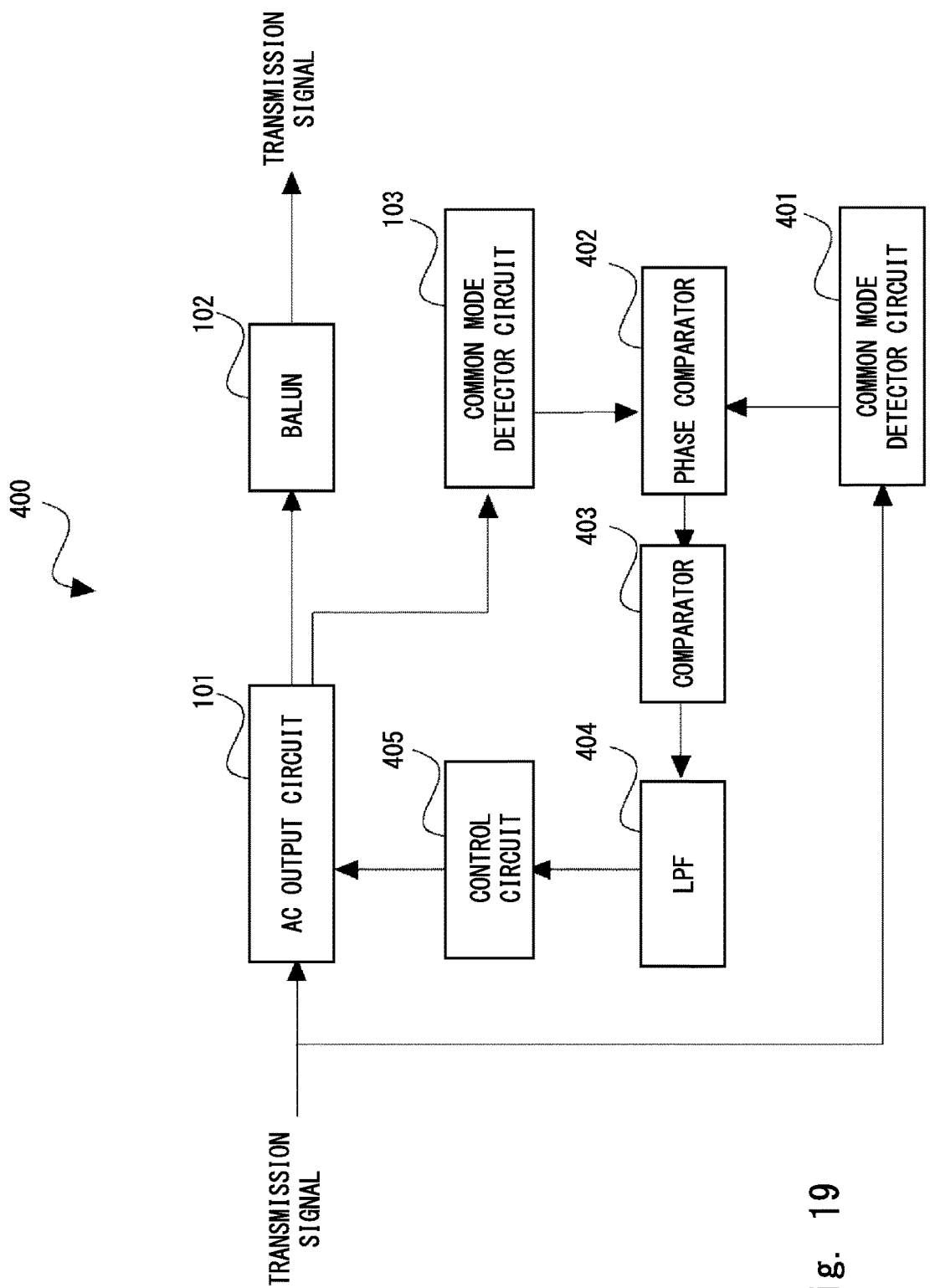
FIG. 19 is a diagram showing the configuration of a semiconductor apparatus according to a fourth embodiment.

FIG. 19 is a diagram showing the configuration of a semiconductor apparatus according to the fourth embodiment. The elements similar to those of the first embodiment are denoted by identical reference characters, and the description thereof will not be repeated.

As shown in FIG. 19, a semiconductor apparatus 400 includes a common mode detector circuit 401, a phase comparator 402, an LPF 403, a comparator 404, and a control circuit 405.

The common mode detector circuit 401 combines the differential signals input to the AC output circuit 101 in common mode, thereby cancelling out odd-order harmonics to obtain direct current and even-order harmonics. Then, the common mode detector circuit 401 outputs the obtained signal to the phase comparator 402.

The phase comparator 402 compares the phase of the signal output from the common mode detector circuit 103 and the phase of the signal output from the common mode detector circuit 401 against each other, and outputs a comparison signal whose voltage is the comparison result. The LPF 403 suppresses the AC component of the comparison signal, and outputs the obtained signal to the comparator 404.

The comparator 404 compares the comparison signal and a prescribed threshold value against each other, and outputs the comparison result to the control circuit 405. The control circuit 405 controls the AC output circuit 101 based on the comparison result.

Figure 20:
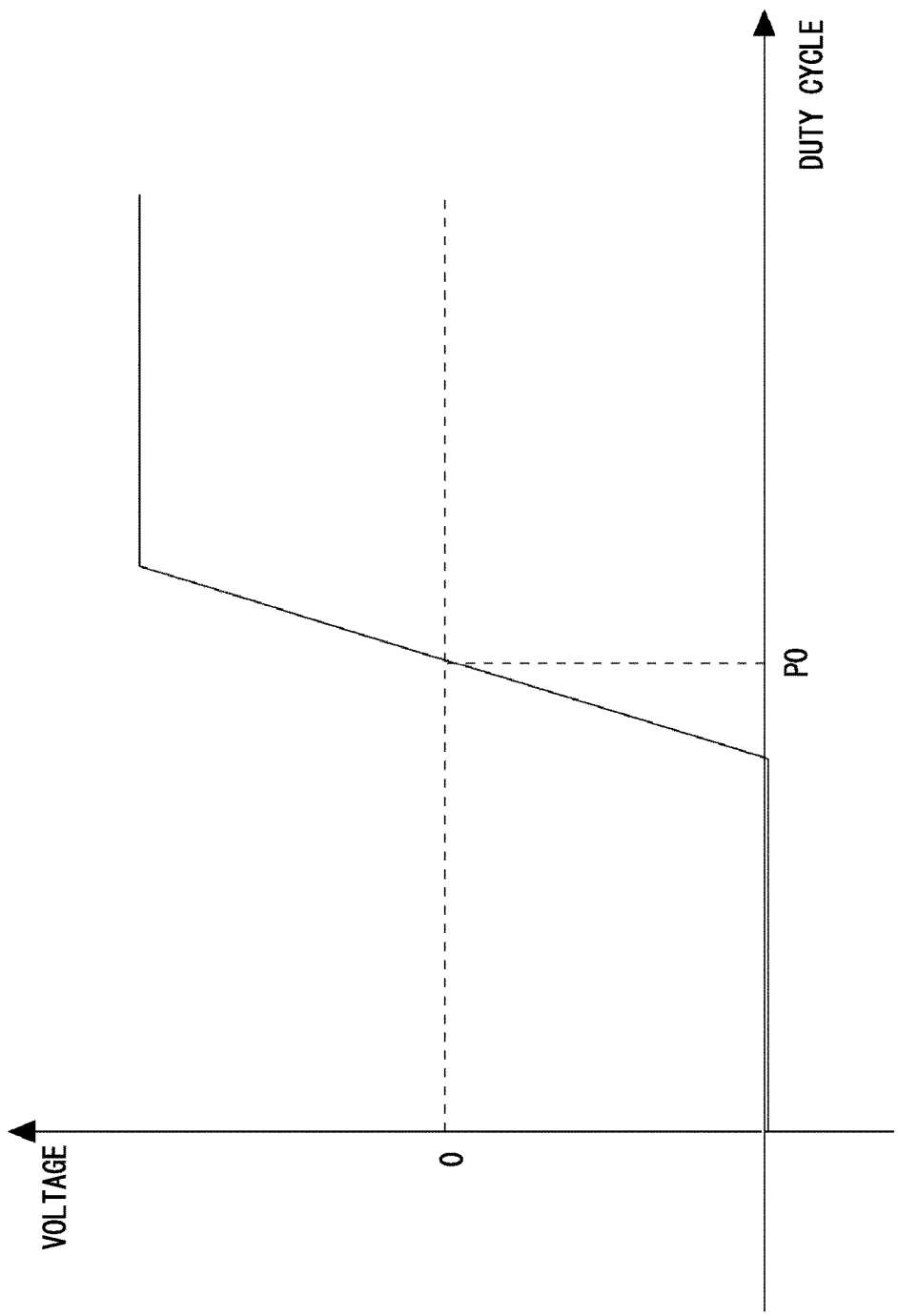
FIG. 20 is a diagram showing the relationship between the duty ratio of the amplifier and the voltage of a comparison signal.

Next, a description will be given of the operation of the semiconductor apparatus according to the fourth embodiment. FIG. 20 is a diagram showing the relationship between the duty ratio of the amplifier and the voltage of the comparison signal. In FIG. 20, the horizontal axis represents the duty ratio of the class-D amplifier of the AC output circuit 101, and the vertical axis represents the voltage of the comparison signal obtained by the phase comparator 402.

The control circuit 405 searches for the duty ratio with which the voltage of the comparison signal and the voltage of the threshold value become equal to each other, as shown in FIG. 20. The control circuit 405 instructs the AC output circuit 101 about the obtained duty ratio.

As described above, with the semiconductor apparatus according to the fourth embodiment, by comparing the phase difference between the differential signals before and after amplification, the optimum duty ratio can be detected.

Fifth Embodiment

In the following, a description will be given of a fifth embodiment with reference to the drawings. The fifth embodiment is an example of the semiconductor apparatus according to the first to fourth embodiments applied to BLE (Bluetooth (registered trademark) Low Energy).

Figure 21:
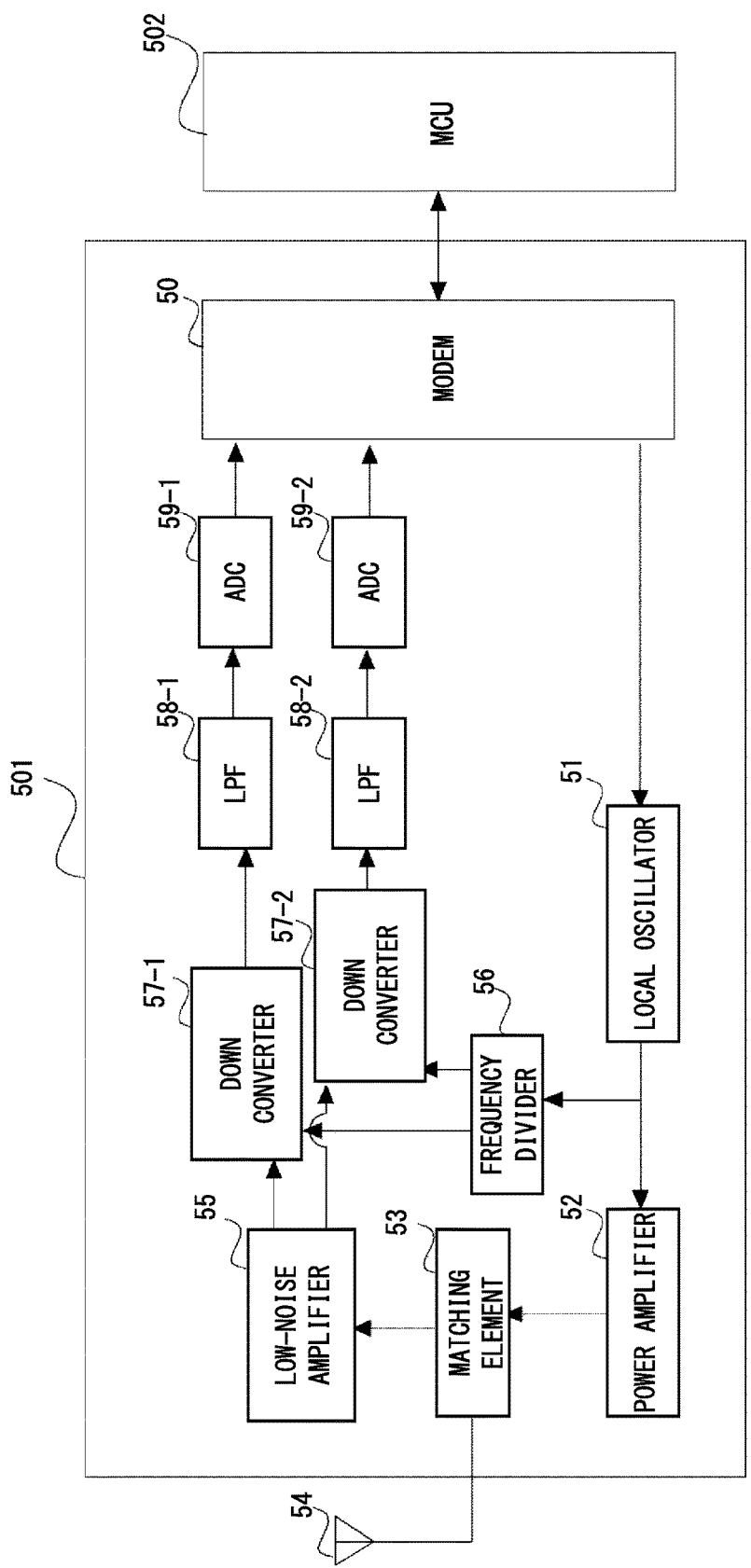
FIG. 21 is a diagram showing the configuration of a radio communication apparatus according to a fifth embodiment.

FIG. 21 is a diagram showing the configuration of a radio communication apparatus according to the fifth embodiment. The elements similar to those of the first embodiment are denoted by identical reference characters, and the description thereof will not be repeated.

In FIG. 21, a radio communication system 500 is configured by a radio communication apparatus 501 and an MCU 502. Further, in FIG. 21, the radio communication apparatus 501 includes a modem 50, a local oscillator 51, a power amplifier 52, a matching element 53, an antenna 54, a low-noise amplifier 55, a frequency divider 56, down-converters 57-1 and 57-2, LPFs 58-1 and 58-2, and AD converters 59-1 and 59-2.

The modem 50 modulates transmission data output from the MCU 502 and obtains a transmission signal, and outputs the transmission signal to the local oscillator 51. Further, the modem 50 demodulates reception signals output from the AD converters 59-1 and 59-2, and outputs the demodulated signals to the MCU 502.

The local oscillator 51 generates a signal of the frequency to be transmitted via radio communication, and superimposes the generated signal on the modulated transmission signal. The local oscillator 51 outputs the superimposed signal to the power amplifier 52.

The power amplifier 52 is a power amplifier that includes the semiconductor apparatus according to any one of the first to fourth embodiments. The power amplifier 52 amplifies the power of the transmission signal, and outputs the amplified signal to the matching element 53.

The matching element 53 adjusts the impedance between the power amplifier 52 and the antenna 54. Further, the matching element 53 matches the impedance between the antenna 54 and the low-noise amplifier 55.

The antenna 54 transmits the transmission signal as a radio signal, and outputs a received radio signal to the matching element 53 as a reception signal.

The low-noise amplifier 55 amplifies the power of the reception signal, and outputs the amplified signals to the down-converters 57-1 and 57-2.

The frequency divider 56 divides the signal of the frequency generated by the local oscillator 51, and outputs the signals to the down-converters 57-1 and 57-2.

The down-converters 57-1 and 57-2 convert the frequency of the reception signals, and output the converted signals to the LPFs 58-1 and 58-2, respectively.

The LPFs 58-1 and 58-2 suppress the high-frequency component of the reception signals, and output the signals to the AD converters 59-1 and 59-2, respectively.

The AD converters 59-1 and 59-2 convert the reception signals from analog signals to digital signals, and output the digital signals to the modem 50.

As described above, with the radio communication apparatus according to the fifth embodiment, detection of the optimum duty ratio through use of the second harmonic can be applied to a radio communication apparatus. Therefore, transmission of unnecessary harmonics via radio communication can be prevented.

Further, when the semiconductor apparatus is to be mounted on a radio communication apparatus, the number of external components connected to the semiconductor apparatus can be reduced.

FIG. 22 is a diagram showing exemplary packaging substrates. In FIG. 22, a substrate 600 is a substrate on which a conventional radio communication apparatus is packaged. The substrate 600 has a semiconductor 601 including an integrated circuit, and an LPF 602. On the other hand, a substrate 610 is a substrate on which the radio communication apparatus according to the present embodiment is packaged. The substrate 610 has a semiconductor 611 according to the present embodiment. As shown in FIG. 22, the substrate 610 is smaller in the number of components other than the semiconductor packaged on the substrate, as compared to the substrate 600.

Figure 23:
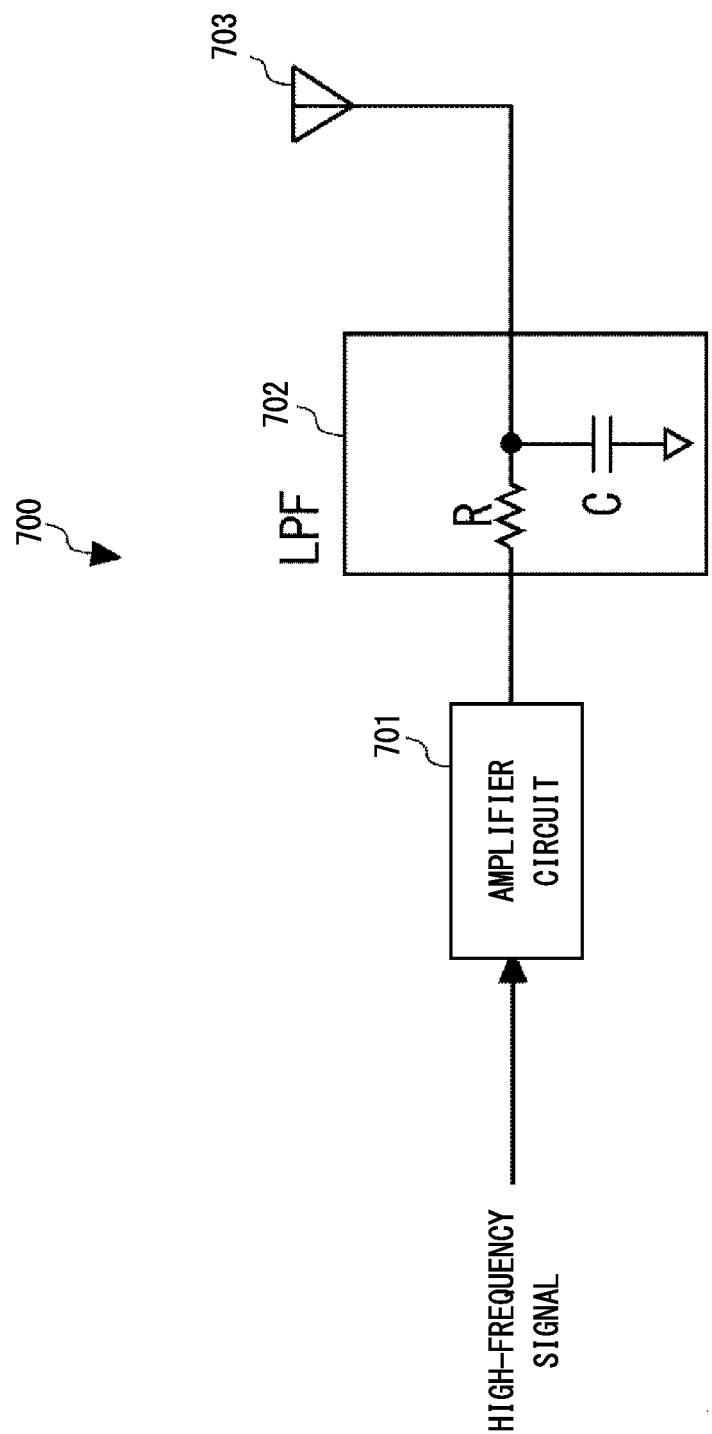
FIG. 23 is a diagram showing an exemplary circuit of a conventional radio communication apparatus.
Figure 24:
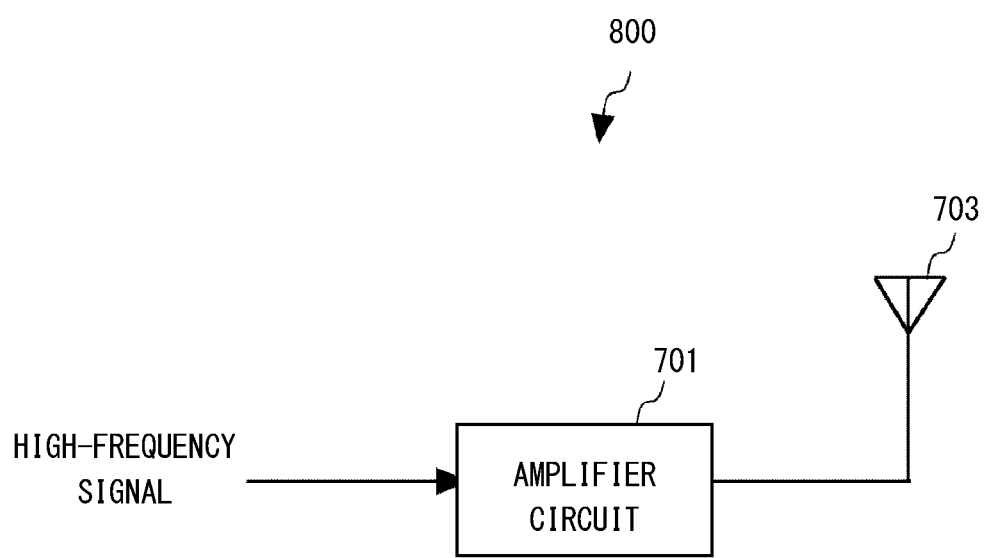
FIG. 24 is a diagram showing an exemplary circuit of a radio communication apparatus according to the present embodiment.

A specific reduction in the number of components will be described with reference to FIGS. 23 and 24. FIG. 23 is a diagram showing an exemplary circuit of the conventional radio communication apparatus. Further, FIG. 24 is a diagram showing an exemplary circuit of the radio communication apparatus according to the present embodiment. In FIG. 23, a conventional radio communication apparatus 700 includes an amplifier circuit 701, an LPF 702, and an antenna 703. On the other hand, in FIG. 24, a radio communication apparatus 800 according to the present embodiment includes an amplifier circuit 701 and an antenna 703.

Comparing FIG. 23 and FIG. 24 against each other, the number of components externally connected to the semiconductor apparatus is smaller in FIG. 24 than in FIG. 23. That is, as described in the first to fifth embodiments, the radio communication apparatus 800 according to the present embodiment is capable of obtaining the amplitude level of harmonics by detecting the even-order harmonics of the signal obtained by the common mode detection. Accordingly, the AC output circuit can be controlled to suppress the amplitude level of the harmonics. Therefore, the configuration for suppressing the amplitude level of the harmonics of the amplified high-frequency signal can be dispensed with. An LPF circuit for an amplified high-frequency signal is greater in the size of the constituent capacitor and resistor, as compared to an LPF circuit for a minor signal. Accordingly, elimination of such an LPF circuit largely contributes toward reducing the size of the radio communication apparatus.

Note that, the radio communication apparatus can be applied to a radio communication apparatus employing BLE, and also to a radio communication apparatus not employing BLE.

As to the specific application of the radio communication apparatus according to the present embodiment, in the case where an apparatus belonging to the fitness and healthcare field, e.g., a heart rate monitor, a blood pressure monitor, or a pedometer, establishes communication with a computer device such as a smartphone via radio signals, the radio communication apparatus can be installed in each of the apparatuses.

Further, the radio communication apparatus can be applied to an apparatus that records the traveling data of a bicycle. For example, in the case where sensors provided at the wheel and handle of a bicycle and a recording computer provided at the handle establish communication with each other via radio signals, the radio communication apparatus can be installed in each of the apparatuses.

Still further, in the case where a watch having a time adjusting function or an incoming mail reporting function establishes communication with an NTP server, a mail server or a computer terminal that receives the mail via radio signals, the radio communication apparatus can be installed in each of the apparatuses.

Still further, in the case where apparatuses, e.g., a keyless entry apparatus, an iBeacon (registered trademark) and the like, establish communication with each other via radio signals, the radio communication apparatus can be installed in each of the apparatuses. Still further, the radio communication apparatus can be installed in a wearable device.

Further, as to the semiconductor apparatus according to the embodiments described above, the conductivity type (p-type or n-type) of the semiconductor substrate, the semiconductor layer, the diffusion layer (diffusion area) and the like may be inverted. Accordingly, in the case where the conductivity type of one of n-type and p-type is the first conductivity type, and the conductivity type of the other one is the second conductivity type, the first conductivity type may be p-type and the second conductivity type may be n-type. Alternatively, the first conductivity type may be n-type and the second conductivity type may be p-type.

Further, other effective embodiment of the present invention may include a method or a system representing the apparatus according to the embodiments described above, a program that causes a computer to execute the entire or part of the process performed by the apparatus, and a radio communication apparatus including the apparatus.

Also, a program for implementing the control operation and the control operation in the above-described control circuit can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

In the foregoing, though the specific description has been given of the invention made by the inventor based on the embodiments, it goes without saying that the present invention is not limited to the embodiments already described above and various modifications can be made within the range not deviating from the gist of the invention.

The first, second, third, fourth and fifth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor apparatus comprising:
   a common mode detector circuit that receives a differential alternating current (AC) signal; and
   a detector circuit,
   wherein the common mode detector circuit calculates an arithmetic mean of the differential AC signal and outputs an even-order harmonic to the detector circuit,
   wherein the detector circuit detects an amplitude level of the even-order harmonic.

2. The semiconductor apparatus according to claim 1, wherein
   the detector circuit includes:
      a detector that detects the amplitude level of the even-order harmonic output from the common mode detector circuit;
      a low pass filter (LPF) circuit that suppresses a high-frequency component of a signal of the amplitude level of the even-order harmonic detected by the detector;
      an amplifier circuit that amplifies the signal of the amplitude level of the even-order harmonic whose high-frequency component has been suppressed by the LPF circuit; and
      a comparator that compares the amplified signal of the amplitude level of the even-order harmonic and a reference voltage against each other.

3. The semiconductor apparatus according to claim 2, further comprising a reference voltage generating circuit that generates a first reference voltage and a second reference voltage, wherein the detector includes a first transistor that detects a signal obtained by addition of the even-order harmonic and the second reference voltage, and a second transistor that detects the first reference voltage.

4. The semiconductor apparatus according to claim 3, wherein, in the LPF circuit, a resistor and a capacitor are connected in parallel between a power supply potential and the first transistor, and a resistor is connected between the power supply potential and the second transistor.

5. The semiconductor apparatus according to claim 4, wherein the comparator compares a voltage of a signal obtained by detecting the signal obtained by addition of the even-order harmonic and the second reference voltage, and a voltage of a signal obtained by detecting the first reference voltage against each other.

6. The semiconductor apparatus according to claim 2, further comprising:
   an AC output circuit that varies a duty ratio and amplifies AC signals, the AC output circuit outputting the amplified AC signals to the common mode detector circuit; and
   a control circuit that obtains a duty ratio with which the amplitude of the even-order harmonic of the AC signals assumes a minimum value from a relationship between the duty ratio of the AC signals and the even-order harmonic based on a comparison result in the comparator, and that instructs the AC output circuit about the obtained duty ratio.

7. The semiconductor apparatus according to claim 6, wherein the control circuit obtains a midpoint between duty ratios at two points at which two voltages in the comparator become equal to each other as the ratio with which the amplitude of the even-order harmonic of the AC signal assumes the minimum value, and that instructs the AC output circuit about the obtained duty ratio.

* * * * *